(12) United States Patent  (10) Patent No.: US 7,822,146 B2
Copeland                    (45) Date of Patent:    Oct. 26, 2010

(54) SYSTEM AND METHOD FOR DIGITALLY CORRECTING A NON-LINEAR ELEMENT

(75) Inventor: Gregory Clark Copeland, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 956 days.

(21) Appl. No.: 11/607,450

(22) Filed: Dec. 1, 2006

(65) Prior Publication Data

US 2008/0129379 A1 Jun. 5, 2008

(51) Int. Cl.
H04L 25/49 (2006.01)
(52) U.S. Cl. .................. 375/296; 375/297; 375/295; 330/149
(58) Field of Classification Search ............. 375/296, 375/297; 330/149
See application file for complete search history.

(56) References Cited

U.S. PATENT DOCUMENTS

| 6,587,514 | B1 | 7/2003 | Wright et al. | |
|---|---|---|---|---|
| 6,973,138 | B1 | 12/2005 | Wright | |
| 7,058,369 | B1 | 6/2006 | Wright et al. | |
| 7,068,980 | B2* | 6/2006 | Seo et al. ............ | 455/91 |
| 2002/0044014 | A1* | 4/2002 | Wright et al. ............ | 330/2 |
| 2003/0223508 | A1* | 12/2003 | Ding et al. ............ | 375/296 |
| 2004/0179629 | A1* | 9/2004 | Song et al. ............ | 375/297 |
| 2004/0257157 | A1* | 12/2004 | Sahlman ............ | 330/149 |
| 2005/0157814 | A1* | 7/2005 | Cova et al. ............ | 375/297 |
| 2005/0163251 | A1* | 7/2005 | McCallister ............ | 375/296 |
| 2005/0286668 | A1* | 12/2005 | Kubin et al. ............ | 375/355 |
| 2006/0240786 | A1* | 10/2006 | Liu ............ | 455/114.3 |
| 2008/0082597 | A1* | 4/2008 | Batruni ............ | 708/322 |
| 2008/0130787 | A1* | 6/2008 | Copeland ............ | 375/297 |
| 2008/0130788 | A1* | 6/2008 | Copeland ............ | 375/297 |
| 2008/0130789 | A1* | 6/2008 | Copeland et al. ............ | 375/297 |

OTHER PUBLICATIONS

Wan, E.A., et al., "The Unscented Kalman Filter for Nonlinear Estimation," Adaptive Systems for Signal Processing, Communications, and Control Symposium (AS-SPCC), IEEE 2000, pp. 153-158.

(Continued)

Primary Examiner—Shuwang Liu
Assistant Examiner—Kenneth Lam
(74) Attorney, Agent, or Firm—John J. Patti; Wade J. Brady, III; Frederick J. Telecky, Jr.

(57) ABSTRACT

System and methods for a digital linearization of a non-linear element. Preferred embodiments provide digital predistortion methods and circuitry that addresses long or "memory" effects and separately shorter duration effects, these two predistortion functions are operated together in an adaptive fashion with a non-linear element to provide a highly linear system. A long predistortion block comprises a plurality of configurable parallel coupled memory blocks, each further comprising a programmable nonlinearity, variable delays, digital filters, and signal combiners. These parallel blocks are selectively configured to provide a parallel filter, a Hammerstein filter and a compound Volterra filter. The parallel coupled memory blocks include programmable parameters that enable real time adaptation of the predistortion; the delay elements also include variable delays. The combined system of the predistortion circuitry and a non-linear element has a linear input-output signal response. Methods for initializing, parameterizing and adapting the system are disclosed.

12 Claims, 14 Drawing Sheets

OTHER PUBLICATIONS

Stapleton, S., "Module 1: Digital Predistortion of Power Amplifiers," Agilent Technologies, Inc., Jun. 2001, pp. 1-31.

Wright, A., et al., "Multi-Carrier WCDMA Basestation Design Considerations—Amplifier Linearization and Crest Factor Control," PMC-2021396, PMC Sierra, Inc., Issue 1, Aug. 2002, pp. 1-34.

"Adaptive Predistortion Using the ISL5239," Intersil Americas Inc., Application Note 1028, Sep. 2002, pp. 1-10.

Sills, J., "Improving PA Performance with Digital Predistortion," www.commsdesign.com/showArticle/?articleID=16506005, Oct. 2, 2002, pp. 1-6.

"Wideband Quad Digital Down-Converter/Up-Converter," Texas Instruments Incorporated, www.ti.com, SLWS142G—Jan. 2003—Revised Nov. 2005, pp. 1-88.

"Implementation of CORDIC-Based QRD-RLS Algorithm on Altera Stratix FPGA with Embedded Nios Soft Processor Technology," Altera Corporation, Mar. 2004, Version 1.0, pp. 1-10.

Sperlich, R., "Adaptive Power Amplifier Linearization by Digital Pre-Distortion with Narrowband Feedback using Genetic Algorithms," School of Electrical and Computer Engineering, Georgia Institute of Technology, Aug. 2005, pp. 1-119.

"Crest Factor Reduction Processor," Texas Instruments Incorporated, www.ti.com SLWS 144B—Feb. 2005—Revised Oct. 2005, pp. 1-82.

Mathews, V. J., et al., "Realization of Truncated Volterra Filters," Chapter 3, *Polynomial Signal Processing,* Copyright 2000 by John Wiley & Sons, Inc., pp. 69-79.

\* cited by examiner

US 7,822,146 B2
// 1

SYSTEM AND METHOD FOR DIGITALLY CORRECTING A NON-LINEAR ELEMENT

CROSS-REFERENCE TO RELATED APPLICATIONS

This application relates to the following co-pending and commonly assigned patent applications: Ser. No. 11/513,735, filed Aug. 31, 2006, entitled "System and Method for Preprocessing a Signal for Translation by a Power Amplifier;" Ser. No. 11/388,356, filed Mar. 24, 2006, entitled "Apparatus and Method Providing Additional Response for an Error Correcting Device", and Ser. No. 11/607,797, entitled "System and Method for Digitally Correcting a Non-Linear Element Using a Multiply Partitioned Architecture for Predistortion" filed contemporaneously with the present application, which applications are also hereby incorporated herein by reference.

TECHNICAL FIELD

The present invention relates generally to a system and methods for digitally linearizing non-linear elements. The system and methods are particularly applicable to high power amplifiers, and more particularly a system and methods are disclosed for linearizing the response of a power amplifier for a communications system, for example, for use in a base station in a cellular telephone system.

BACKGROUND

Generally, power amplifiers as are used in the communication art exhibit non-linear output characteristics, particularly as the transmit power level is increased in response to the input signal. Non-linear behavior results in distortion in the output signal that is undesirable, and may cause the communications system to fail to meet the required performance metrics as set by standards organizations or the governing regulatory agencies. However, as is well known, any power transistor driving a load will act in a non-linear fashion when operating in the transistor saturation region, that is, the linear relationship of the voltage input-voltage output characteristic is only maintained in the linear operation region of the transistor. As the input signal power is increased to and beyond the saturation point of the driving transistors in the power amplifier, the response of the transistor(s) does not change linearly and the power output characteristic therefore inherently becomes non-linear.

An important application for non-linear elements, for example, these power amplifiers, in the current art are in the area of wideband cellular communications. A typical application for a power amplifier is a forward or transmitter function for a cellular telephone base station (of course, the base station also receives as well, however the receiver function is not addressed here). Communication is accomplished using several well known standard protocols for voice and/or data transmission, for example CDMA, WCDMA, TDMA, GSM, EDGE, 3G and the like. These applications require and will continue to require increasing amounts of data to be transmitted over the cellular system. Further the communications units may be devices other than cell phones, including wireless portable email terminals, computers both fixed and portable such as laptops and palm computers, fixed location, handheld, and vehicle mounted telephone equipment, personal internet browsing devices, even video equipment and other communications or data receiver or transmitter applications. In these applications and other applications, RF transmit power is used and applied to a power amplifier with significant power consumption, so that distortion may occur when the input signal and the power applied take the power amplifier into operating regions where the output signal is not a linear function of the input signal.

FIG. 1 depicts a simplified schematic of the RF transmit portion (sometimes called the "analog" portion) for such a prior art base station application. (Only a single RF transmit function and one antenna is shown, however, many may be used). In FIG. 1, digital baseband transmit data $V_{FF}$ is input to a digital to analog converter (DAC) 3, which outputs analog data for transmission to a frequency converter 5 that is clocked by a local oscillator 15. The frequency converted analog signal is next presented to a power amplifier 11, and the resulting analog amplified output signal $V_{out}$ is presented to an antenna 14 for transmission. A feedback path then returns an observed version of the analog transmitted signal $V_{out}$, labeled $V_{FB}$, for observation through a coupler 13. This is accomplished, for example, by coupling the antenna signal to a second frequency converter 17 which is likewise clocked by local oscillator 15, the converted analog observation signal is then processed by analog-to-digital converter 19 and digital signals $V_{FB}$ are made available for observation, and for use in compensation of the transmit signal using feedback techniques. (Note that the voltage $V_{FB}$ is not the voltage received from other transmitters at the antenna, these are sent along a different path to an RF receiver, which is not addressed here).

During operation of such an RF transmit function, it is known that as for any power amplifier where a power transistor drives a load based on an input signal, if the output signal to be generated is such that the transistor enters its saturation region, the output becomes non-linear; that is the output no longer varies linearly with the input signal. This effect is described as non-linear distortion in the output signal. A simple and somewhat effective approach to limiting non-linear power amplifier distortion known in the prior art is to "back off" the output power, so that the amplifier operates only within the linear part of its voltage response characteristic. However, to be effective this output power backoff must account for the peak-to-average ratio (PAR) of the input signal. In order to account for the PAR, and still output the correct signal, the required transmit power backoff to maintain linear performance of the driving transistors therefore becomes very significant. This results in very low amplifier efficiencies. A metric sometimes used in the art for describing the peak amplitude verses average amplitude of a signal is the term "crest factor". As an example, a CDMA signal of the present cell phone systems may exhibit a PAR of up to 13 dB. Power backoff is a source of inefficiency in the operation of the power amplifier, because the amplifier is being intentionally operated at lower than possible output power levels for a given supply power. This amplifier inefficiency results in additional power consumption during operation of the system and therefore increases the manufacturing costs of the system, because to achieve a certain output power requires that a much more powerful amplifier be used, while if the backoff were not required, a lower gain amplifier can be used, and lower costs for the system would accrue. When "back off" is used to prevent distortion in the output, this inefficiency results in increased operating or ownership costs for the system, as the operating power expended for the actual transmit power is increased.

One prior art approach to reducing the amount of "backoff" required is to modify the input signal prior to applying it to the power amplifier by applying "crest factor reduction" or CFR. When CFR or peak amplitude reduction is applied to a signal, large amplitude peaks are identified in the input signal, a compensating signal with an opposing crest is created and then this inverted signal is combined with the input signal so as to remove only the largest peaks in the input signal, and so reduce the crest factor, i.e. reduce the PAR, prior to presenting the signal to the power amplifier for transmission. This approach advantageously reduces the amount of "backoff" required to maintain the power amplifier in its linear range, and efficiency for the system is thus increased. Processors specifically designed to provide the CFR function are commercially available, for example Texas Instruments, Inc. supplies integrated circuits designated as part no. GC1115 particularly directed to implementing CFR in communications systems. The GC1115 is a crest factor reduction preprocessor that receives digital upconverted input signals as I (in phase) and Q (quadrature phase) form digital signals, for example, and outputs a modified I,Q, signal with the peaks removed for transmission with reduced PAR. The GC1115 integrated circuit is operated by a programmable DSP executing software. Other manufacturers offer similar integrated circuit solutions for implementing CFR in commercial transmit systems as is known in the art.

In addition, or as an alternative to crest factor reduction, power amplifier distortion may be addressed by amplifier linearization techniques. Known approaches are to "linearize" the power amplifier by placing a preprocessing element between the input signal and the power amplifier. Prior art analog linearization approaches include the use of a non-linear, inverting amplifier in a feed forward architecture which is designed to produce a signal output that has distortion. This signal has distortion that is in direct opposition to the distortion observed in the power amplifier for a given input signal, the inverting distortion is amplified by a second amplifier, and the output is subtractively combined with the output of the power amplifier prior to presenting the signal to the antenna. In this manner, the overall response of the amplifier system as observed at the transmit antenna remains linear. From a complexity standpoint, the analog feed forward inverse distortion function must be very precise over a range of voltages, temperatures and conditions and thus implementing such a system can be costly, and in fact it may not be possible to build a practical amplifier to achieve the desired performance goals. From an efficiency point of view, the added analog amplifier adds additional power consumption similar to the power amplifier itself, which therefore may in fact result in no improvement over the power amplifier alone in a "backoff" configuration.

As an alternative approach to linearizing power amplifiers, digital predistortion circuits ("DPD") are also known in the prior art and are increasingly used. Typically these are described as implementing algorithms which may be implemented conveniently using existing DSP circuits for example, digital filters in combination with microprocessors and memory devices, or using integrated circuits which implement the algorithm in dedicated hardware as one or more ASICs, gate arrays, or custom integrated circuits. An off the shelf predistortion circuit for use in linearizing an amplifier is sold by Intersil Corporation, designated Intersil part number ISL 5329. The digital predistorters of the prior art typically attempt to create an inverse distortion to that distortion expected or known in the power amplifier, and this inverse distortion is applied on the input signal prior to presenting the signal to the power amplifier. Thus the two amplifier gain stages are operated in a cascade, and the predistorter amplifier provides an "inverse" function to compensate for the distortion expected in the power amplifier. The inverse distortion can be based on a model for the power amplifier which predicts the power amplifier distortion based on the currently observed samples of the incoming signals. Alternatively, a look up table solution can be developed using experimental observations of the power amplifier over a range of expected input signal situations. The predistorter and the amplifier are coupled in cascade to attempt to compensate the overall signal characteristic, and to cause it to be linear over the operating range of the power amplifier.

One disadvantage of the digital predistortion approaches of the prior art is that many current approaches assume the power amplifier is a "memoryless" non-linear amplifier. A memoryless approach begins with the premise that the output of the power amplifier at a given time depends solely on the input signal at that given time, and not on other effects. This may be considered a "0th" order polynomial representation filter. The prior art approach assumes the non-linear element distortion is simple, that is AM-AM (amplitude) and AM-PM (phase) distortion. However, in practice it is known that a power amplifier has significant memory effect performance characteristics. The term "memory" and "memory effects" refers to effects that are non-linear effects in the power amplifier response. These effects may include envelope effects and frequency effects. Envelope effects may be primarily the result of thermal hysteresis and electrical characteristics of power amplifiers. Frequency memory effects are due to variations in the frequency spacing of the input signals and may be characterized by shorter time constants. The temperature of the amplifier at an instant in time may in fact be partly determined by a thermal effect sometimes referred to as "self heating" that occurs during periods of peak power transmission, the temperature also depends on the environment which may include climate effects. Alternatively the amplifier may operate at a cooler than normal temperature for periods of no or little power transmission. The ambient temperature, which may or may not include the effect of operating heating and air conditioning equipment, may change rapidly or slowly and affect the distortion of the power amplifier. The previous signal transmissions and the ambient operating environment therefore create various short and long term memory effects; thus an effective amplifier linearizing method and system must address these long term or memory effects, in addition to the memoryless effects. That is, to effectively linearize the non-linear element (the power amplifier in this case) the design approach and system must incorporate adaptive functions that adapt for memory effects. In fact, it may be practically impossible to create a real time "inverse" amplifier predistortion circuit that can be commercially implemented for certain amplifiers and applications.

FIG. 2 depicts one typical prior art approach to predistortion for a power amplifier. In FIG. 2, power amplifier 25 is depicted as a circuit element, the digital to analog converter, driving transistors, and in the feedback path, the required analog to digital converter, as are shown in FIG. 1 are not depicted in full in FIG. 2, but are included in the box enumerated 25 including the power amplifier denoted "PA".

Digital predistorter 21 modifies the input signal $V_{IN}$ before it is presented to the power amplifier 25 in a manner intended to invert the distortion that will occur in the power amplifier, and therefore, linearize the output of the overall system. An input signal sequence x(k) is received and is coupled to magnitude squared detecting unit 27 and a random access memory block 33 labeled RAM1. An adaptive device 29 receives the output of the magnitude detecting device 27. Adaptive device 29 may be a look up table (LUT) or alternatively, a more complex polynomial expression unit (POLY) may be used.

The adaptive device 29 provides a predistortion signal to the multiplier 31. The node 31 uses input signal x (k) and the predistortion signal to present a corrected signal $V_{FF}$ to the power amplifier PA, which presents signal $V_{OUT}$ to the antenna or other output device. Note that in this predistortion scheme, it is observed that the predistorter can be made rotationally invariant, thus the adaptive circuit 29 only needs to receive the magnitude squared data of the input signal to affect the signals in the desired manner.

A feedback path provides a feedback form of output signal $V_{OUT}$ (appropriately frequency converted and following analog to digital conversion as shown in FIG. 2,) $V_{FB}$, to a second random access memory device 35 labeled RAM2. Memory storage devices RAM1, RAM2 are coupled with a processing unit 37 labeled SP which may be, for example, a commercially available digital signal processor (DSP). Other processors such as fixed and floating point processors, reduced instruction set (RISC) machines, multiprocessor devices, and programmable microprocessors such as x86, Pentium, ARM, MIPS and other known processors may be utilized, or a custom processor may be provided. Signal processor 37 uses information relating to the input signal $V_{IN}$ from the memory device RAM1 and correction information relating to the output signal $V_{OUT}$ from the memory device RAM2, and based on difference determined between the two captured stored signals, provides a correction signal to adaptive circuit 29. The correction signal relates to differences between the observed output signal $V_{OUT}$ and input signal $V_{IN}$, and is based upon the assumption that ideally, the signals $V_{OUT}$ and $V_{IN}$ should be substantially equal except for scaling (the scaling being the desired gain provided by the power amplifier PA) and other intended differences. Undesired differences detected in the comparison between the input signal and the observed output signals are assumed to have been introduced by the predistorting device 21 or the PA 25; these are then sought to be cancelled by the correcting signal.

FIG. 3 is a graphical depiction of the $V_{OUT}$-$V_{IN}$ curves of the prior art circuits of FIG. 2. The ideal or linear response is represented by the line labeled IDEAL in FIG. 3, the dashed line. The response for a typical power amplifier PA is the solid curved line labeled PA. The possible digital predistortion curve for a predistorting signal is the solid line labeled DPD. The combined response curve that can be expected is the line labeled DPD+PA in FIG. 3.

In FIG. 3, it can be seen that when the output voltage $V_{OUT}$ (vertical or Y axis) exceeds the voltage where the power amplifier transistors are saturated (VSAT) the response will become increasingly non-linear. However, even at voltages below that level, the operation of the power amplifier alone is non-ideal as can be seen from the curves, the response moves away from the linear, IDEAL line at lower operating voltages. However, in the area of the graph labeled "Feasible Operation" it is possible to linearize the amplifier (in a simple case, such as illustrated here) using a digital predistortion function that predistorts the signal, this is seen by comparing the curve labeled DPD+PA with the IDEAL curve, in the "Feasible Operation" region it is the same as the line labeled IDEAL, or in effect, the amplifier is linearized. In the area labeled "Infeasible Operation", it is not possible to correct the distortion. Thus the use of CFR techniques along with a digital predistortion scheme may be important in order to fully linearize a non-linear element in a particular application, otherwise even with a predistortion function, the system may operate in a non-linear region.

The design approach of a system incorporating a prior art predistortion circuit can be best understood by considering the system as two cascaded gain stages, one for the power amplifier, and one for the predistorter circuit. This arrangement is depicted simply as two blocks in FIG. 4. Here the voltage characteristic of the digital predistorter 21 is depicted having a first voltage transfer characteristic, and the voltage characteristic of power amplifier 25 is depicted having a second voltage transfer characteristic exhibiting the typical non-linear characteristic of a power amplifier.

The design goal of a digital predistortion system is to create a combined linear input-output gain of G for the system, so that the gain F of the predistorter satisfies the function of:

$$F(H(V_{IN}))=G(V_{IN})=V_{OUT}$$

where H is the gain of the power amplifier, F is the gain of the predistorter, and G is the ideal linear gain of the cascaded system.

With reference now to FIG. 5, there is shown an exemplary basestation system 50 as is known in the prior art for the forward transmission path for existing cellular systems. The power amplifiers in such a system are known to be non-linear elements.

In FIG. 5, network switch 51 is depicted which receives information from a networked system, for example, a typical network fabric in a conventional wired or land line telephony system. A plurality of base band processors 55 are coupled in a parallel fashion to receive and transmit information to and from the network switch 51. Element 57 is a baseband switch distribution block which combines (depicted only in the forward transmit direction, although received signals are also processed) baseband data for the individual communications channels for each baseband processor 55. Radio Card/RFM module 61 includes a formatter, forward transmit processor, data converter for transmission TX RF, and on the receiver side, data converter for received signals RX RF, a digital down converter which may be implemented, as shown here, with Texas Instruments part no. GC5016 programmable up/down converter or an equivalent, and a control processor 59.

Radio Card/RFM 61 includes processing circuitry for processing the baseband signals prior to presentation to the power amplifier and in the prior art may incorporate digital predistortion circuitry. Power amplifier 41, as shown in FIG. 1, is a transmit power amplifier which is the amplification element to be linearized. Duplexer 65 will pass the signals to be transmitted to the antenna 71 and separates the received signals and passes those to tower mounted amplifier (TMA) modulator 67, which is coupled to the receive input of RFM 61. Radio Card/RFM 61 is shown as a single instantiation in FIG. 5; however in a practical system there may be many such cards in a given application as indicated by the replicator dots shown beneath element 61. Power amplifier 41 is simplified for illustration and includes the amplifier RF transmit and receive circuitry of FIG. 1 for the transmission of analog signals output at antenna 71. Duplexer TX/RX filter 65 combines and separates the transmitted and received signals. TMA block 67 is a tower mounted amplifier that performs the function of amplifying the received signals from the antenna 71. It is recognized that many other elements such as noise filters, bandpass filters, upconverters and downconverters, may be used as is known in the art, however these are not illustrated in FIG. 5 for the purpose of keeping the illustration simple in this explanatory example.

Downconverter GC5016 is a commercially available digital downconverter integrated circuit available from Texas Instruments, Inc. and other similar circuits are available from other vendors as is known to those skilled in the art. This integrated circuit receives digital data from the analog to digital converter in the power amplifier and provides a conversion to a lower frequency, and decimation of the signal required to use the received signal in the baseband processors.

In operation, the system of FIG. 5 receives signals from the Net Switch 51, these are individually processed by the baseband processors 55 as channels, these are then combined for transmit messages, (or separated for receive messages), by the baseband switch/distributor 57, and the signals are provided to one of the radio cards/RFM 61. The signals for forward transmission to a cellular/wireless telephone system, for example, are then provided to the transmit processor in digital form, predistortion and linearizing steps are performed, the data is converted to analog format, up converted and once in the appropriate form, provided to the power amplifier 41 and driven out as a transmission signal on antenna 71. Received signals at the antenna are separated from the transmit signals in block 65, the duplexer, attenuated at TMA block 67 and provided to the analog to digital data converter RX RF, the digital data signals are then down converted by GC5016 integrated circuit or another similar down-converter, and provided through the BP IF/format block to the baseband switch 57, and then separated into channels for processing by the base band processors 55, and the resulting data is placed back in the switched network via switch 51.

Thus, there is a continuing need in the art for a system and method that provides efficient adaptive linearization of a non-linear element, such as a power amplifier for RF transmission. The system and methods should be realizable using commercially available technology. Embodiments and methods of the present invention described below address this need.

SUMMARY OF THE INVENTION

These and other problems are generally solved or circumvented, and technical advantages are generally achieved, by preferred embodiments and methods of the present invention. Preferred embodiments of the present invention implement digital predistortion circuitry including a memoryless or short duration memory digital predistortion circuit or SDPD, a feedback observation function which captures a version of the output signal from a non-linear element such as a power amplifier, an additional adaptive digital predistortion circuit or long DPD that addresses memory or longer duration effects, and preferably including a QR decomposition or QRD function which synthesizes a compensating error signal in response to an input signal, and in preferred embodiments, the system of the invention combines these signals into a predistorted digital signal which is then presented to the non-linear power amplifier for transmission. By combining these various predistortion and compensation functions to predistort the signal, the system achieves effective linearization of the power amplifier.

By approaching the design solution in multiple partitions or steps, the combination of the non-linear element, for example the power amplifier and the short memory digital predistortion function may be treated as a "black box" forming a second non-linear element, which may then be further linearized by an additional, adaptive predistorter function that is directed to longer term or memory effects, and by the QR decomposition function, preferred embodiments of the invention advantageously partition the various processing steps down into multiple, real time executable steps that may be implemented in current integrated circuit technology and is implemented using commercially available programmable signal processors for control.

The methods of the present invention advantageously recognize that in real time operating environments, it may be impossible and infeasible to construct an accurate "inverse" model of the system for use in a predistortion scheme that can operate at real time, such as used by prior art systems and methods. In contrast, the approach of the preferred embodiments of the present invention is to model the various pieces of the system in software and to adapt the models to accurately synthesize the error expected from various points in the system, and to use the accurate synthesized error to precondition the signal prior to amplification by the non-linear element. This approach eliminates the distortion in the output. In contrast to the prior art "system inverse" approach of the prior predistortion schemes, a "system identification" approach is used. The use of the software models to initialize and then adapt the various predistortion blocks during operations allows the on-going adaptation to occur "offline", while the system concurrently continues to operate, therefore avoiding interruption of service for recalibration or adaptation, as in certain prior art schemes.

In accordance with preferred methods of the invention, the system uses a QRD function to synthesize the expected error for a given input state, this is a hardware adaptation useful for compensating for very long duration effects; this is then combined with the output of an adaptive long memory digital predistortion or long DPD block for other long effects. In one example preferred implementation, these long or memory effects are of duration of greater than 100 nanoseconds and up to about one microsecond. This combined signal is then preferably applied to another adaptive short DPD block which adapts for distortion effects of less duration than the longer or memory effects. In one example implementation, these shorter duration effects are of less than 100 nanoseconds in duration. Finally this adaptively modified and predistorted signal is presented to the non-linear power amplifier for transmission. The system of the invention is a closed system, that is, feedback observation of the output of the non-linear element is utilized to adapt the system. A delayed version of the input is compared to the actual amplifier output as a means of generating the actual error, however in contrast to the prior art where an inverted power amplifier model was created, the method of the invention models the error and adaptively updates the model, this error is then synthesized and applied to the signal in advance to the short digital predistortion. Each of the several predistortion functions of the invention is therefore broken into pieces that may be practically implemented, and real time calculations may be performed, either in dedicated hardware, or in software running on a commercial processor.

The novel predistortion functions and methods disclosed may also be each applied as an independent digital predistortion approach, in alternative preferred embodiments of the invention, and these embodiments also have advantages over the predistortion approaches of the prior art. The longer duration predistortion block described may be used alone to linearize a non-linear element, alternatively the shorter duration predistortion block of another preferred embodiment may be used independently to linearize a non-linear element. In the most preferred embodiments, these blocks are combined together in a preferred predistortion system or circuit. In yet another preferred embodiment these blocks are formed in a single integrated circuit to perform predistortion for linearizing a non-linear element, such as, in one example, a power amplifier.

Software models of the non-linear element, the short memory digital predistortion block, and the long digital predistortion block are developed and methods to synthesize the expected error is used to adaptively modify the signal through predistortion before amplification, and so to linearize the overall response. The use of the software models advantageously allows "offline" updating of the system, that is, the models may be periodically updated and adaptive coefficients generated for the various adaptive predistortion blocks, even while the system continues concurrently to operate in real time.

In accordance with a preferred embodiment of the present invention, a system and method for linearizing a power amplifier for a transmit function is to provide an additional configurable predistortion filter to address the long duration or memory distortion effects, in addition to the use of a novel short duration digital predistorter function to address the short term distortion effects. Preferably, the filters of the invention implements filters in the form of FIR filters using FFT, IFFT, DFT or DCT transform computation techniques. Alternatively, filters in the form of Kautz or Laguerre filters may be used. These embodiments are FIR/IIR filters where the taps are weighted and summed to yield desired outputs.

In accordance with another preferred embodiment of the present invention, a system for linearizing a power amplifier comprises first receiving baseband signals to be transmitted, these are input into a short duration digital predistortion function; the output of this first predistortion function (which may be dedicated circuitry, software for execution on a programmable signal processor, or a combination of these) is combined with a delayed version of the input signal, and an error signal is developed. Simultaneously, the input signals are processed and provided to an adaptive predistortion function that compensates for longer term or "memory" effects, which may also be implemented as dedicated circuitry, programmable circuitry executing software, or a combination of these, this longer function also receives as a feedback input a signal representing the error at the output of the power amplifier which is used to provide real time correction for an adaptive filtering function.

In another preferred embodiment, a predistortion circuit for linearizing the response of a non-linear element by compensating for memory effects causing distortion is provided, comprising a magnitude squared block for receiving baseband input signals to be transmitted to the non-linear element, the magnitude squared block outputting a magnitude squared value; a plurality of parallel coupled memory blocks each further comprising a programmable nonlinearity, programmable delay elements, digital filters, signal multipliers and summers with multiplexers for configuring each of the blocks responsive to one or more control signals coupled to the multiplexers; a first summer for combining the outputs of the parallel coupled memory blocks; and, a second summer for combining the output of the first summer with the baseband input signal having an output for transmitting the predistorted signals to the non-linear element.

In another preferred embodiment for the predistortion circuit described above, the plurality of parallel coupled memory blocks is each arranged so that a programmable nonlinearity receives the output of the magnitude squared data, the output of the programmable nonlinearity is coupled to a digital filter, and the output of the digital filter is coupled to the multiplexers for configuring the respective parallel coupled memory block. In a further preferred embodiment, each of the plurality of parallel coupled memory blocks further comprises a second programmable nonlinearity coupled to a delay element that receives the magnitude squared data, and the second programmable nonlinearity has an output coupled to a signal multiplier that is further coupled to a multiplexer.

In an alternative preferred embodiment, the predistortion circuit is coupled to form a filter having a nonlinearity coupled to the baseband input signal and having a linearity coupled to the nonlinearity in any order, and outputting data from the filter for transmittal to the non-linear element. In a further preferred embodiment the predistortion circuit forms a Hammerstein filter.

In an additional preferred embodiment, for the predistortion circuit, pairs of the parallel coupled memory blocks are configured together in a parallel cascade arrangement to form a compound Volterra filter. In another preferred embodiment, the parallel memory blocks are coupled to form a predistortion circuit that performs a fast Fourier transform; a convolution of the transformed outputs, parallel inverse fast Fourier transforms of the convolution results and an output signal is formed by summing the outputs of the inverse fast Fourier transform blocks together with the baseband input signals. This output is a preprocessed or predistorted version of the baseband input signals for transmission to the non-linear element.

In another preferred embodiment, an integrated circuit for preprocessing signals for transmission by a non-linear element to linearize the response is provided, comprising a predistortion circuit coupled to receive baseband signals and generating output signals for transmission to the non-linear element to compensate for memory effects that are known to cause distortion in the non-linear element, the predistortion circuit comprising a magnitude squared circuit for outputting a magnitude squared output, a plurality of parallel memory blocks coupled to receive the magnitude squared output and each comprising a programmable nonlinearity, variable delay elements, a digital filter, at least one signal combiner and at least one multiplexer responsive to a control signal to configure the parallel blocks, and a summer coupled to sum the outputs of the parallel memory blocks and to generate the output. A feedback path having an input to receive data from the output of the non-linear element is provided coupled to a first capture buffer to capture data from the feedback path and a second capture buffer is coupled to capture the baseband signals. Inputs for coupling to a signal processor operable for providing parameters adapting the programmable nonlinearities and the variable delay elements within the parallel coupled memory blocks are provided. The integrated circuit is controlled by the signal processor to linearize the output response of the combination of the non-linear element and the predistortion integrated circuit, the signal processor analyzing the stored data in the first and second capture buffers.

In an additional preferred embodiment, the integrated circuit has the parallel memory blocks coupled to perform a parallel fast Fourier transform on the received baseband data, perform a convolution on the transformed data, and perform an inverse fast Fourier transform in parallel, and sums the outputs of the parallel coupled memory blocks with the input baseband signals to adaptively predistort the baseband signals, responsive to parameterization data received from the signal processor.

Yet another preferred embodiment of the invention is a circuit for predistortion of a signal to be transmitted to the non-linear element, comprising an input for receiving baseband signals to be transmitted to the non-linear element, a digital predistorter adaptively modifying the baseband signals to compensate for distortion in the non-linear element and generating an output, the digital predistorter comprising an Nth order digital filter coupled to a linear equalizer, wherein N is greater than 0; a feedback path input for receiving an output of the non-linear element as feedback signals; a first capture buffer coupled to the feedback path input operable to capture and store feedback signal samples for observation; a second capture buffer coupled to capture and store delayed signal samples collected from the input for observation; and an input for receiving parametric values to be stored within the digital predistorter by an external signal processor in response to analysis of captured signals stored within the first and second capture buffers.

In a preferred alternative embodiment, the digital predistorter of the circuit described in the previous embodiment further comprises a magnitude squared circuit that generates a magnitude squared output; m parallel coupled programmable nonlinearities coupled in series with m variable delay elements that delay the magnitude squared data; tapped variable delays coupled to the input; multipliers receiving the output of the m parallel programmable nonlinearities and the output of the tapped variable delays, outputting M multiplier outputs; a summer receiving the M multiplier outputs and outputting the sum of the multiplier outputs; and an equalizer comprising a programmable multiple tap FIR filter with adaptive coefficients coupled to the summer and generating the output of the digital predistorter.

In yet another preferred embodiment, the predistorter circuit in the previous embodiments further each uses, for the programmable nonlinearities, an interpolating look up table that stores non-linear programmable table entries determined by the magnitude squared data and that further stores programmable interpolation values, and outputting a programmable interpolated value between table entries finally determined by the least significant bits of the input.

In yet another preferred embodiment of the invention, the equalizer of the prior embodiments comprises four parallel FIR filter stages coupled to receive real and complex signal inputs; a pair of summers each coupled to combine the outputs of two of the four parallel filter stages; the summers each combining cross terms of the real and complex filter stages and the equalizer having programmable weights to equalize imbalances in the real and complex signals. In yet another preferred embodiment, the predistortion circuit further includes an embodiment where the Nth order FIR filter has variable delay taps, and the taps are non-sequential.

In an alternative preferred embodiment, an integrated circuit for predistorting signals for transmission by a non-linear element is provided comprising an input for receiving baseband signals to be transmitted; a predistortion circuit coupled to the input and generating output signals operable to compensate for short term effects of less than 100 nanoseconds that are known to cause distortion in the non-linear element, the predistortion block comprising an Nth order digital filter coupled to a linear equalizer, wherein N is greater than 0; a feedback path input to receive feedback signals from the output of the non-linear element; a first capture buffer coupled to capture and store signals from the feedback path input; a second capture buffer coupled to capture and store baseband signals from a delayed path coupled to the input; and inputs for coupling to an external signal processor that is operable for providing parameters adapting the predistortion circuit, responsive to analysis of stored signals in the first and second capture buffers.

In another preferred embodiment, the integrated circuit includes the predistortion circuit comprising a magnitude squared circuit coupled to the input and outputting a magnitude squared output; M parallel programmable nonlinearities coupled in series with variable delay elements receiving the magnitude squared output; a plurality of variable delay taps coupled to the input; M multipliers receiving the output of the M parallel programmable nonlinearities and the output of the variable delay taps, outputting M multiplier outputs; a summer receiving the multiplier outputs and outputting the sum of the multiplier outputs; and an equalizer comprising a programmable multiple tap FIR filter with adaptive or fixed coefficients coupled to the output of the summer, generating the output signals of the digital predistortion block for transmission to the non-linear element.

In yet another preferred embodiment, a system for predistorting a signal for transmission to a non-linear element to linearize the response of the non-linear element is provided, comprising a first digital predistortion block coupled to the input and generating an output for adaptively modifying the received baseband signals to compensate for distortion effects of a first duration in the non-linear element, the first digital predistortion block comprising a plurality of parallel coupled memory blocks, each of the parallel coupled memory blocks comprising at least one programmable nonlinearity, at least one signal multiplier and at least one summer; a second digital predistortion block coupled to the first digital predistortion block and generating an output for transmission to the non-linear element, for further adaptively compensating for distortion effects in the non-linear element of a second duration shorter than the first duration, the second digital predistortion block comprising a generalized Nth order digital filter coupled to a linear equalizer, wherein N is greater than 0; a feedback path is provided as an input for receiving an output of the non-linear element as feedback signals; a first capture buffer is coupled to the feedback path and operable to capture and store signal samples collected from the feedback path input for observation; and inputs are provided for receiving parametric values to be stored in the first predistortion block and the second predistortion block by an external processor responsive to analysis of signals stored in the first capture buffer.

In yet another preferred embodiment, an integrated circuit for linearizing a non-linear element by predistortion of a signal is provided, comprising an input for receiving baseband signals, a first digital predistortion circuit coupled to the input and generating an output for adaptively modifying received baseband signals to compensate for distortion effects of a first duration, the first digital predistortion block comprising a plurality of parallel coupled memory blocks, each of the parallel coupled memory blocks comprising at least one programmable nonlinearity, at least one signal multiplier and at least one summer; and comprising a second digital predistortion circuit coupled to the first digital predistortion circuit and generating an output for transmission to the non-linear element, for further adaptively compensating for distortion effects in the non-linear element of a second duration shorter than the first duration, the second digital predistortion block comprising a generalized Nth order digital filter coupled to a linear equalizer, wherein N is greater than 0; and a QRD circuit coupled to the input and operable to output an adaptive signal to be combined with the output of the first predistortion block, the QRD function compensating for distortion in the non-linear element of a third duration, the third duration being greater than the first duration. A feedback path input for receiving an output of the non-linear element as feedback signals is provided, a first capture buffer is coupled to the feedback path to capture and store signal samples collected from the feedback path; and inputs are provided for receiving parametric values to be stored in the first predistortion block and the second predistortion block by an external processor, responsive to analysis of signals stored in the first capture buffer.

Although certain preferred embodiments are described as implemented in a digital circuit such as an integrated circuit, with certain programmable features being implemented in software running on a control processor such as a RISC or DSP processor, alternative approaches for implementation are contemplated including dedicated hardware such as dedicated RF circuitry, analog hardware, and dedicated hardware in place of programmable processors, to implement the novel functions described.

An advantage of preferred embodiments of the present invention is that the functions are partitioned into pieces that operate in an independent fashion, such that real time execution of the adaptive filtering, long duration or memory digital predistortion, QRD, short term or "memoryless" predistortion, and combining functions is possible using existing semiconductor integrated circuits for real time execution of the algorithms.

Methods for providing software models used for initializing and adapting the parameters of an adaptive digital predistortion system controlled by an external signal processor are provided. A preferred method for adapting a predistortion processor is providing the predistortion processor comprising a first digital predistortion block coupled to an input receiving baseband signals for adaptively modifying the received baseband signals to compensate for distortion effects of a first duration in the non-linear element, the first digital predistortion block comprising a plurality of parallel coupled memory blocks, each of the plurality of parallel coupled memory blocks comprising at least one programmable nonlinearity, at least one digital filter, at least one signal multiplier and at least one summer; and providing a second digital predistortion block coupled to the first digital predistortion block and generating an output for transmission to the non-linear element, for further adaptively compensating for distortion effects in the non-linear element of a second duration shorter than the first duration, the second digital predistortion block comprising a generalized Nth order digital filter having programmable parameters coupled to a linear equalizer, wherein N is greater than 0; and providing a feedback path input for receiving an output of the non-linear element as feedback signals.

This preferred method continues by coupling the feedback signals to a first capture buffer operable to capture and store signal samples collected from the feedback path input for observation; then observing the stored feedback signals from the predistortion processor and the baseband input signals; then defining a first software model for the non-linear element having parameters, and adapting the parameters within the first software model until an error between the first software model and the non-linear element is minimized; defining a second software model of the second digital predistortion block having parameters and adapting the parameters of the second software model until an error between the second software model and the second digital predistortion block is minimized; defining a third software model of the first digital predistortion block having parameters and adapting the parameters of the third software model until an error between the third software model and the first digital predistortion block is minimized; transferring the adapted parameters for the third software model of the first digital predistortion block to the programmable nonlinearities within the first digital predistortion block; transferring the adapted parameters within the second software model of the second digital predistortion block to the programmable parameters within the second predistortion block. The preferred method continues by processing baseband signals input to the predistortion processor for transmission to the non-linear element by performing signal predistortion using the parameterized first digital predistortion block and using signal predistortion in the parameterized second predistortion block to further modify the signals prior to transmission of the signals to the non-linear element.

In an another preferred method, the method above continues, by periodically again adapting the parameters of the first software model, the second software model, and the third software model, to minimize an error determined by comparing and observing the response of the software models to signals and observing the response of the first predistortion block, the second predistortion block and the non-linear element to the same signals; and by updating the parameters within the first predistortion block and the second predistortion block.

Preferred methods for developing the software models include modeling the blocks as a nonlinearity coupled with a linearity, estimating an initial linearity, estimating an initial nonlinearity, calculating a minimum error solution to the model linearity and nonlinearity, and initializing the parameters for the software models so obtained. In another preferred method, the modeling of the nonlinearities uses an extended Kalman filter to solve the models. In yet another preferred method, the use of an unscented Kalman filter for solving the nonlinearities in the models is described.

A further advantage of a preferred embodiment of the present invention is that it may be combined with additional known signal conditioning approaches such as crest factor reduction, Farrow, and other known approaches to reduce the PAR or otherwise condition the input signal, prior to inputting the signals to the transmit digital predistortion circuitry.

Another advantage of a preferred embodiment of the present invention is that existing basestation or other non-linear systems such as power amplifiers may incorporate the additional adaptive digital predistortion functionality allowing upgrades to be made to existing equipment to add the advantageous benefits of the use of the invention by replacing the existing "transmit processors" with the system and software of the invention.

Other advantages and benefits will be described in the detailed description that follows.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
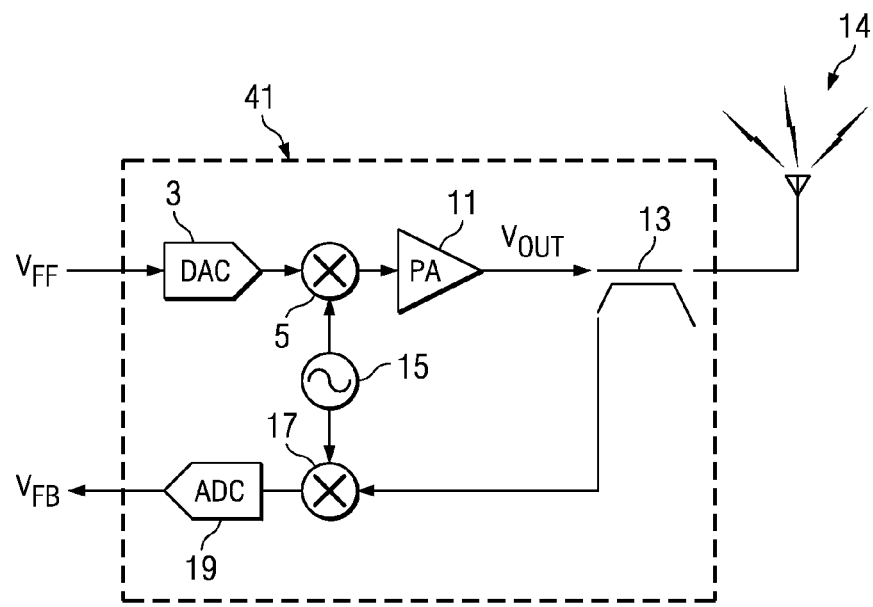
FIG. 1 depicts a prior art RF transmit function incorporating a power amplifier and an antenna.
Figure 2:
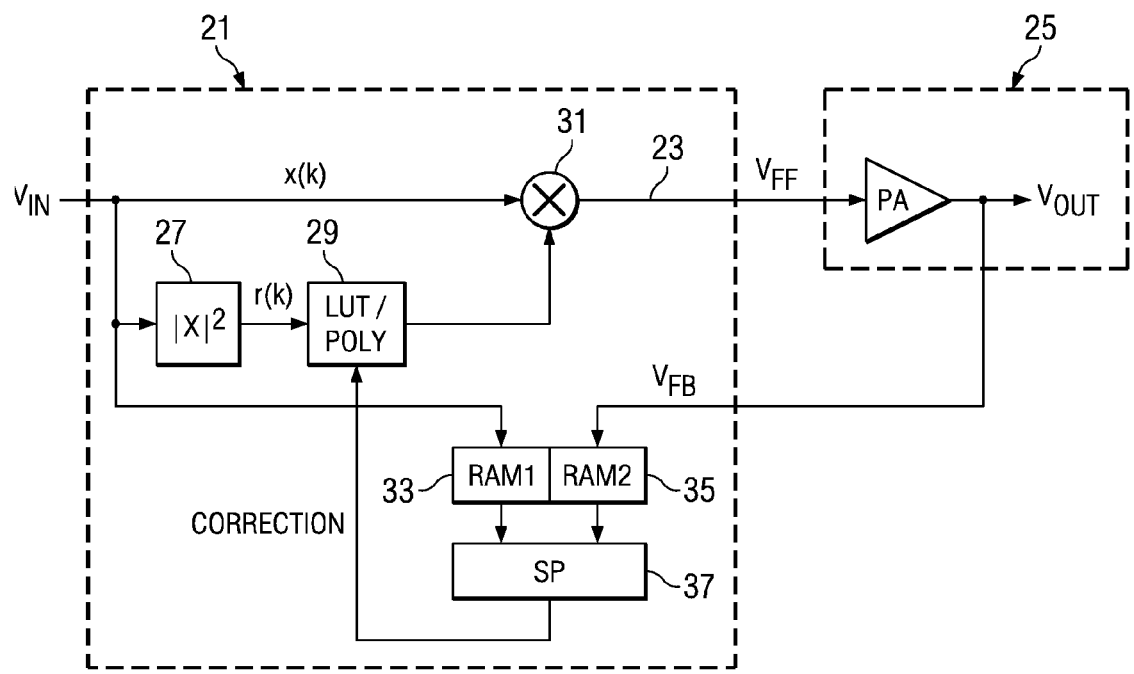
FIG. 2 illustrates in block diagram form the functions of a prior art predistortion circuit used with a power amplifier.
Figure 3:
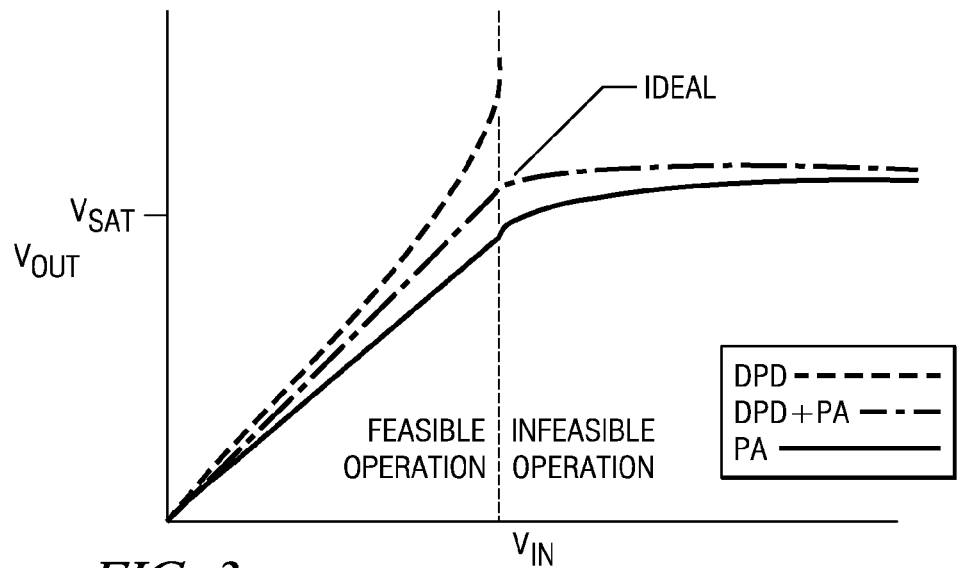
FIG. 3 depicts voltage input voltage output characteristics for the prior art predistorter and the non-linear element in a typical application.
Figure 4:
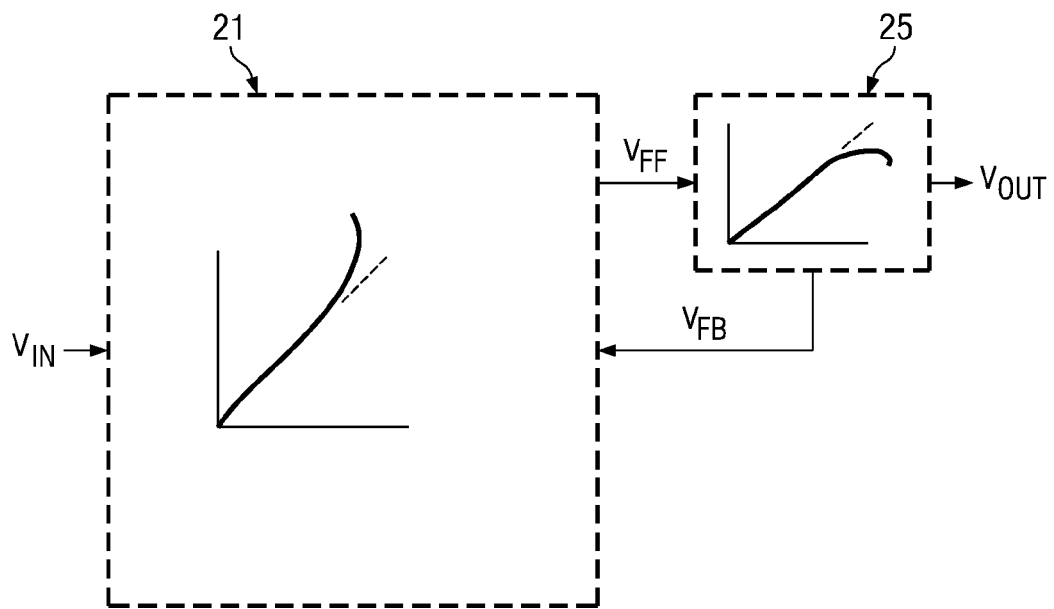
FIG. 4 is a diagram illustrating the effect of predistortion in a typical system incorporating a digital predistortion processor.
Figure 5:
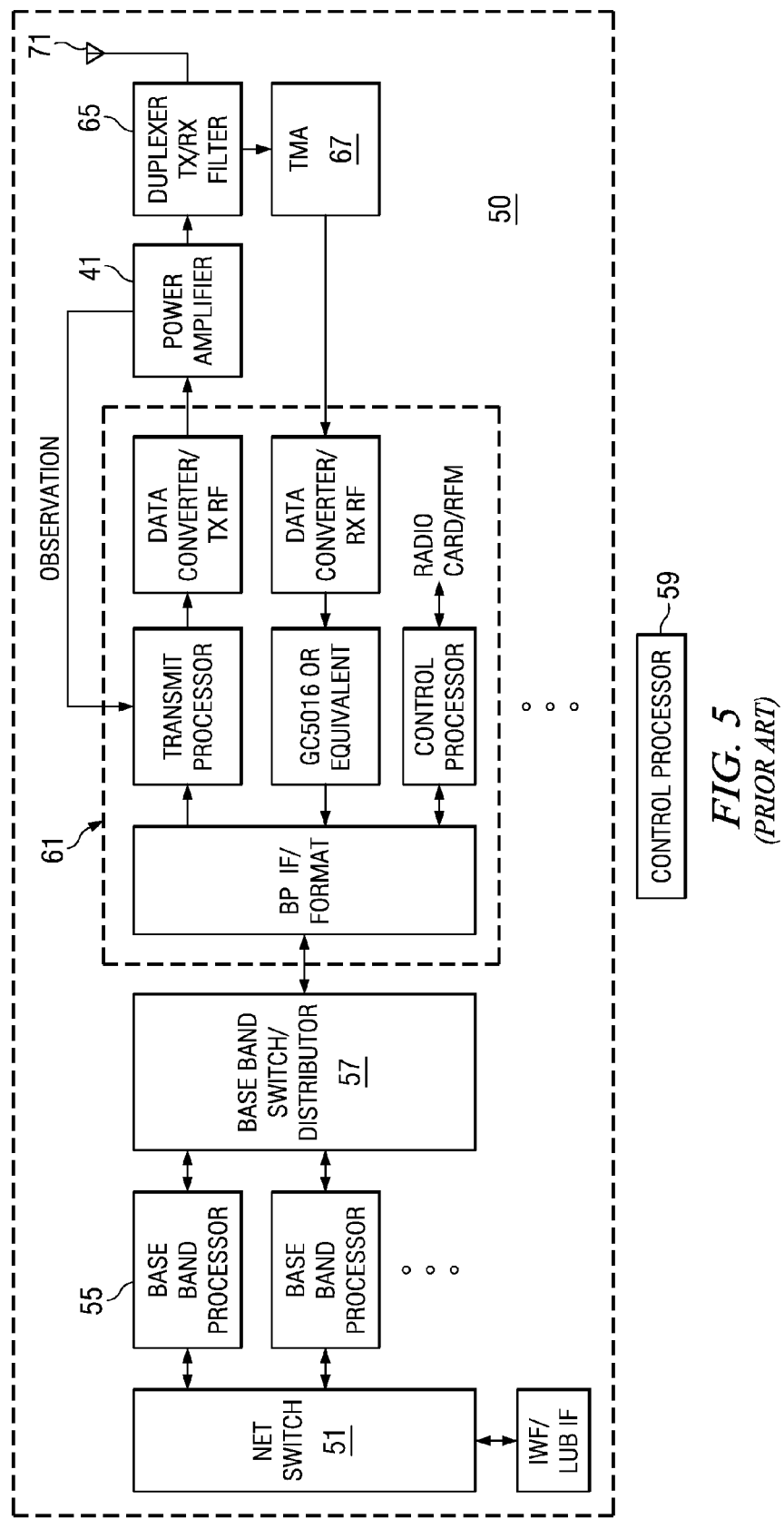
FIG. 5 is a block diagram illustrating the major functional blocks used in a prior art transmit and receive system for a baseband cellular station.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a non-limiting, exemplary context, namely for use with a transmitter including a power amplifier, for use in a basestation in a cellular communications system which is an RF transmitter. The system and methods and preferred embodiments of the invention may also be applied, however, to other power amplifiers where linearizing the input-output transfer characteristic is desirable, for example power amplifiers for wireless LAN applications and the like. Any non-linear element where distortion is expected and thus predistortion and linearization is desirable may benefit from application of embodiments of the invention. The system, methods and preferred embodiments of the invention may also be applied to linearizing non-linear elements in other applications than signal transmission.

The transmit processor circuit illustrated in block diagram fashion in FIG. 6, a preferred embodiment of the invention that is planned for commercial use and preliminarily designated the Texas Instruments' GC5322 baseband transmit processor, incorporates many of the features of the present invention and will be described in detail below. The present invention may be embodied in other arrangements and using alternative embodiments as well, additional preferred embodiments will be described. The present invention may be incorporated into an integrated circuit implementing an entire function or incorporating the required digital signal processing circuitry, or other useful functions as is known in the art. The blocks shown may be repartitioned and the functions of two or more blocks combined or the functions of a single block split into multiple blocks or into multiple circuits, or even multiple integrated circuits, while still remaining within the scope of the invention and the appended claims, repartitioning of the system is contemplated as is known in the art.

Before beginning the detailed discussion of the preferred embodiments, the general approach of preferred methods of the present invention is to treat the linearization problem differently than the prior art approaches. Instead of attempting to create an inverse model of the non-linear element (so-called system inverse) which is then applied as predistortion to the incoming signals prior to transmitting them to the non-linear element, the approach of the invention is to provide various elements that track the system by accurately outputting the very small error that is expected in the system, and to use this synthesized error to compensate the signal prior to presenting the signal to the non-linear element, this is considered a "system identification" approach. It has been advantageously discovered that this "error tracking" approach leads to practical solutions to system predistortion. These solutions can be implemented in real time using existing semiconductor and integrated circuit technology and software.

For an explanatory example, consider the power amplifier in a transmitter application. The amplifier and the predistorter function can be considered as a function:

$$F(x) = e^{j\Theta} F(xe^{-j\Theta})$$

By observing that the power amplifier is inherently causal, and that the system is rotationally invariant, the expression for F may be rewritten:

$$F(x) = [e^{j f\Theta(|x|)} f_r(|x|^2)] x$$

or $$F(x) = G(x)x$$

In short, the predistortion function and the amplifier together are a complex gain function. The approach of the preferred method and system embodiments of the invention is to implement the predistortion function as a series of blocks, first a short duration memory or "memoryless" digital predistortion (SDPD) block is coupled to the non-linear amplifier, and then these two blocks in cascade together are treated as a single non-linear element which requires additional predistortion compensation, next an additional long or "memory" digital predistortion function (long DPD) for compensating for longer duration or "memory" distortion effects is provided, and preferably a QRD block is also provided that acts as a hardware compensation function. The QRD block is a real time hardware block that synthesizes an adaptive signal based on the present inputs, which may be considered a "synthesized error", this expected synthesized error is removed from the signal stream as part of the compensation scheme, and this compensated signal is finally provided to the non-linear element for amplification and transmission.

Figure 6:
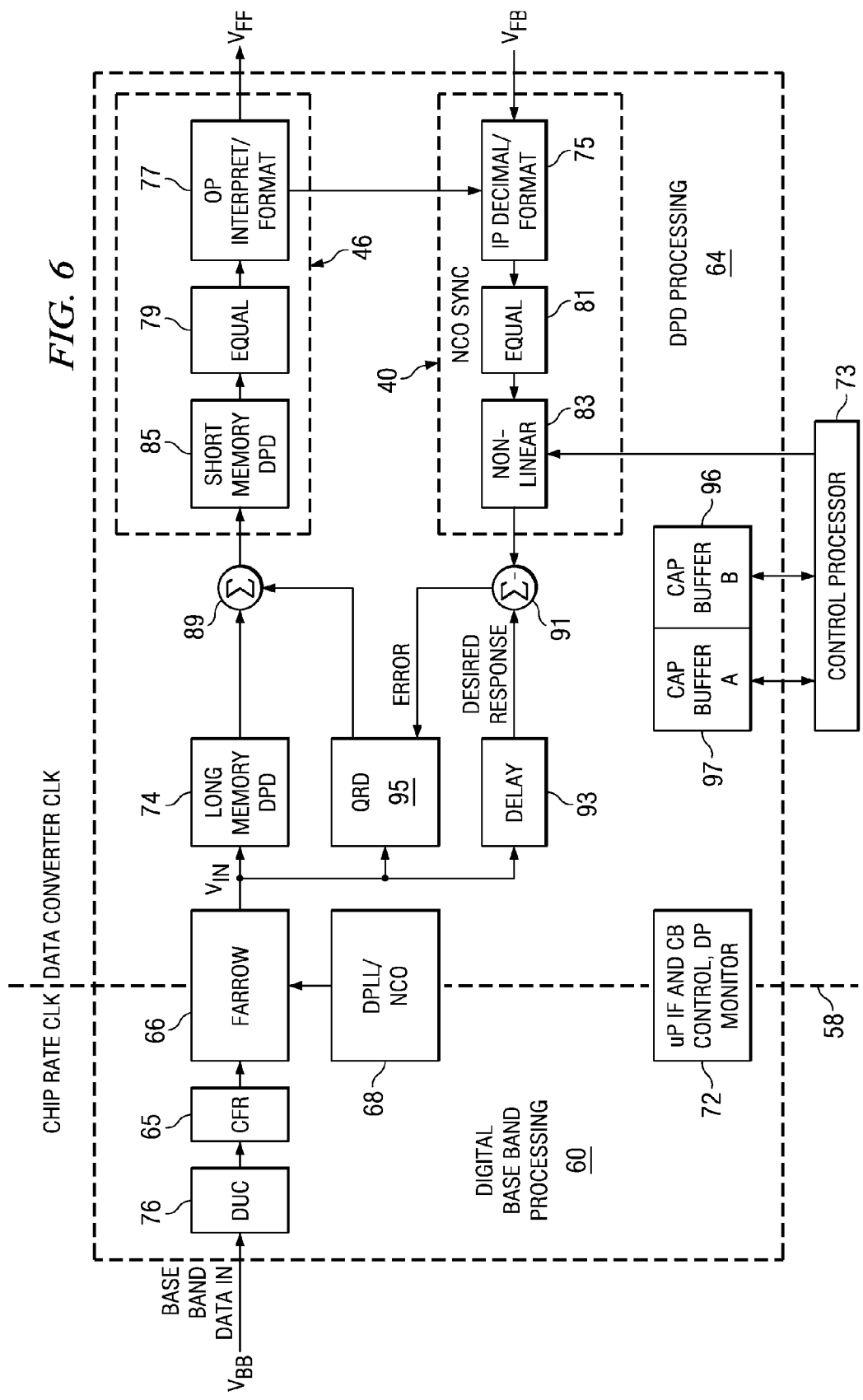
FIG. 6 is a block diagram of a preferred embodiment of the invention, an exemplary novel transmit processor function useful in systems such as depicted in FIG. 5.

FIG. 6 depicts, in block diagram form and in an illustrative manner, the major functional blocks in a first preferred embodiment of a transmit processor incorporating the predistortion functions of the invention. This novel transmit processor is preferably implemented as a single integrated circuit as represented by the dashed outline, coupled to a control processor 73. There are two timing sections, the Digital Baseband (BB) processing section 60, and the digital predistortion processing (DPD Processing) section 64. Alternative embodiments would be to place each of these timing sections in separate integrated circuits, although this approach is less preferred. Digital baseband data $V_{BB}$ is input to the section 60 which is clocked at a Chip Rate Clock. Digital up converter (DUC) 76, which may be as an example, a block operating similar to the functions provided by the GC5016 device sold as a stand alone integrated circuit by Texas Instruments, Inc., receives the input signal. Other up converter functions as are known in the art may be used. Block 65 receives the output of the digital up converter DUC 76 and applies crest factor reduction (CFR) such as is described in the background section. Block 66 is clocked by the digital PLL or numerically controlled oscillator timing block 68 and provides Farrow re-sampling and interpolation to the signal. Farrow block 66 is clocked by a timing function 68 which may be implemented using a digital phase locked loop or DPLL, a numerically controlled oscillator or NCO, or other clock or oscillator circuitry as is known in the art. The output of Farrow block 66 is then provided to the digital predistortion function which is enumerated as 64. Farrow block 66 retimes the signal for use by the digital predistortion (DPD) processing side 64, which is clocked at the data converter clock rate. Thus the Farrow block 66 provides synchronization or timing boundary function between the baseband functions, clocked at a chip rate, and the data converter functions, clocked at a data converter rate.

In the digital predistortion block 64, long memory DPD function 74 provides predistortion for effects of longer duration, e.g. long or "memory" effects, and will be described in greater detail below. The QRD block 95 provides hardware QR matrix decomposition and is described in detail in co-pending and related U.S. patent application Ser. No. 11/388, 356, filed Mar. 24, 2006, entitled "Apparatus and Method Providing Additional Response for an Error Correcting Device", which is incorporated herein by reference in its entirety. Delay element 93 provides a delayed reference signal to compare the input response (delayed) to an observed output feedback response from the antenna. This is done because ideally, the output of the DPD processing section is proportionally equal (accounting for desired gain) to the output at the antenna, if the system is operating to fully linearize the power amplifier output. In that case, which is the expected case when all of the elements are parameterized and operating normally, the error is virtually zero.

The output of this comparison labeled "error" (the output of summer 91 with an inverting input) is the error between the observed signal from the feedback path $V_{FB}$ and the reference signal (which is a delayed and scaled version of the input signal) is coupled as an input to the QRD block 95. The output of that QRD block 95 is coupled to a summer 89 and combined with the output of the long memory block 74. The output of the summer 89 is then coupled to a short DPD block 85 which applies predistortion to the signal to address the short duration, or almost "memoryless" linear and non-linear distortion effects, in one embodiment this block may be implemented using hardware similar in operation to the pre-distortion functions of the prior art, however in a preferred embodiment described below, a novel implementation of the short DPD function uses a higher order polynomial filter, including some memory compensation, is preferably used in the processor of FIG. 6. The output of this short memory predistortion block 85 is then applied to an equalization function 79 and to an output upconverter 77 which applies interpolation and formatting to produce the final digital form output.

Collectively the short memory DPD block 85, the equalizer 79, and the output upconverter 77 are referred to as block 46. The output signal $V_{FF}$ is then applied to the digital to analog converter, and the power amplifier, and finally transmitted to an antenna, using RF transmit circuitry such as shown in FIG. 1 as element 41 and described above. The feedback or observation path $V_{FB}$ comes from an analog to digital converter as shown in FIG. 1, for example, and is coupled into the input path decimation and formatting block 75, where the signal is decimated and formatted, an equalizer function 81 is applied to the signal which operates analogously to equalizer 79 in the transmit path. Non-linear block 83 is then applied and this observed signal is input to the summer/comparator 91 as described above. These functions, input decimation/format 75, equalizer 81, and non-linearizer 83 are collectively referred to as the feedback path 40.

There are two data capture buffer blocks 97 and 96 labeled Cap Buffer A and Cap Buffer B. These capture and storage memories are used to observe the desired response signals (A) and the observed response signals from the feedback path (B) and to store these signals so that comparisons, adaptation, and computations may be performed. Control processor 73 can use these stored samples to perform "off line" calculations and generate weighting parameters in order to adapt the response of the short and long memory blocks, shown above, as will be further described below. Although not detailed in FIG. 6, an input multiplexer is provided as part of each capture buffer 97 and 96 and selects different points in the system for capturing observation data, so that the data can be used in calculations and analysis by the processor 73. In additional preferred embodiments, known debugging methods and hardware such as checksums, triggers, start and stop trace breakpoints, endpoints, and the like may be implemented as part of the capture buffers A, B. These functions are preferably used to collect data following a specific system event being detected, and although not shown in detail these memories 97 and 96 may include various additional data ports for parallel or serial access. These added ports may be used by an off chip processor or computer acting as a debugger, running emulation tools for software development, and the like.

Some significant features of the transmit system incorporating the various functions of the invention are evident from the block diagram of FIG. 6. In operation, the cascade combination of the short memory DPD block 85 and the power amplifier (not shown but coupled to the $V_{FF}$ output of the FIG. 6) may advantageously be treated together as a "black box" amplifier requiring further linearization. The added blocks QRD (95) and the long memory DPD function (74) provide additional novel digital linearization to address the long term, or "memory" effects that the short effect digital predistortion block 85 cannot address. In contrast to the prior art approaches, the approach of the present invention advantageously utilized by the embodiments does not require an "inverse system" function that exactly mimics the power amplifier and transmit system to be linearized using predistortion. Instead, a "system identification" approach is used, the expected error signal is modeled, and predictive filtering is used to cause the system to behave so as to eliminate the expected error. The models provide an accurate representation of the error in different parts of the system, so that the system is adapted based on the error expected for a particular set of inputs, in combination with the distortion error of memory effects that are known to occur due to prior signal transmissions, temperature dependent effects, noise effects including observation noise, and the like.

In a preferred embodiment, a synthesized linear error may also be predicted and synthesized by the QRD block in front of the power amplifier and then subtractively combined with the input signals. This is done so as to predistort the input signal to eliminate the error at the output. The preferred embodiments and methods of the present invention thus provide a novel adaptive amplifier linearization system that may be practically implemented in a manner that allows real time adaptive compensation, far beyond what was possible in the predistortion approaches of the prior art.

Figure 7:
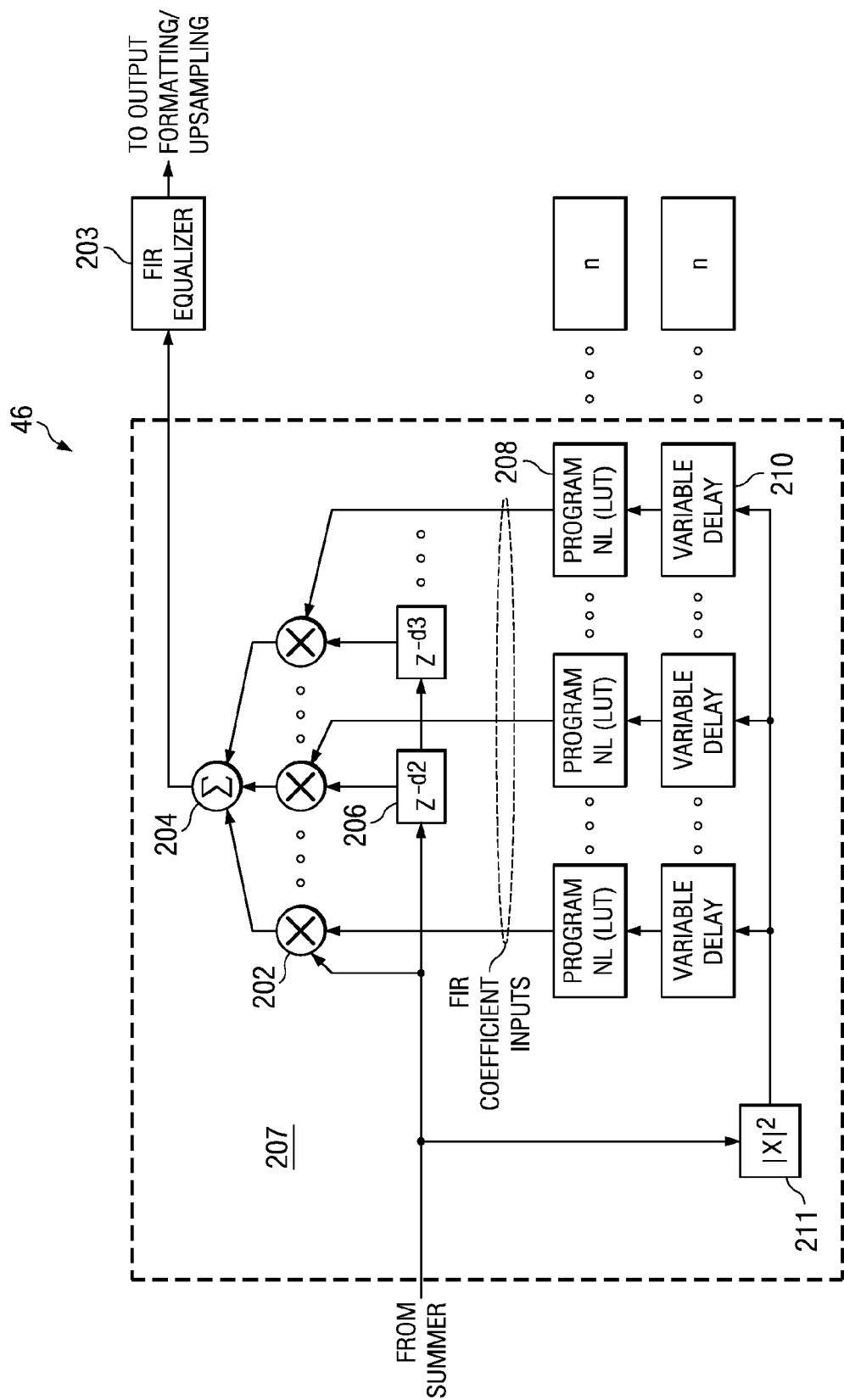
FIG. 7 is a block diagram depicting the functions of the short memory DPD block of a preferred embodiment of the transmit processor of FIG. 6.

Implementation details of selected blocks of the transmit processor of FIG. 6 will now be presented. FIG. 7 depicts in block form a preferred embodiment for the detailed implementation of the short DPD block 46 and the equalizer of FIG. 6. It should be understood that although the Nth order polynomial filter block 207 and equalizer 203 illustrated in FIG. 7 is a preferred embodiment of the short DPD function to be used, the transmit processor system of the present invention could also be implemented using a more conventional "0th order" or "memoryless" DPD block, and due to the unique architecture and the modeling methods and design approach of the present invention, significant advantages would still be achieved. However it is preferred to use the short DPD block 46 as shown in FIG. 7.

In FIG. 7, the short DPD block 46 comprises a polynomial function 207 coupled to the input, the output of which is coupled to three paths in parallel, each path comprises a variable delay element 210 having a programmable delay coupled to a magnitude squared block 211, which in each path then is coupled to a programmable nonlinearity, the programmable nonlinearities 208 are preferably implemented as a look up table or LUT, other possible implementations include polynomial functions. The three programmable nonlinearities 208 (more or less than 3 can be used, as shown by the replicator dots in the figure) then feed in parallel fashion into a programmable filter which is a variable delay finite impulse response filter (FIR). In one preferred embodiment it was determined that a useful implementation of this function is a 3 tap FIR, although many other embodiments are also possible for a given application. The output of the programmable filter is then input into the equalizer 203. The output of the equalizer 203 is then coupled on to the output formatting block 77 in FIG. 6.

The delay elements 206, multipliers 202 and summer 204 form an Nth order general FIR filter. In an alternative embodiment the variable delay functions 210 can be placed after the programmable nonlinearities 208 and before the multipliers 202. In the preferred embodiment shown in FIG. 7, those skilled in the art will recognize that the preferred embodiment of the short DPD block 207 provides a Volterra filter coupled to an equalizer 203, the equalizer may be for example a 16 tap, and processor programmed FIR with adaptive or fixed coefficients. The equalizer 203 provides elimination of linear distortion, and the Volterra filter 207 eliminates non-linear, short term, distortion.

Volterra filters are used in the art for modeling and analysis of non-linear systems. The use of Volterra series expansions to address polynomial non-linear systems is described in further detail in the book "Polynomial Signal Processing", by V. John Mathews and Giovanni L. Sicuranza, Copyright 2000, John Wiley and Sons, and in particular Chapter 2, entitled "Volterra Series Expansions", pages 19-63.

In a preferred embodiment for the example of a base station transmit processor, the short DPD block 46 is preferably comprised of a non-linear Volterra filter 207, in cascade with a linear FIR filter equalizer 203. In this manner the short block 46 addresses both linear and certain non-linear distortion effects expected in the power amplifier. In one known preferred embodiment, the delays in the Volterra filter are such that the short DPD block addresses effects of less than 100 nanoseconds in duration. These effects can be frequency dependent non-linear distortion, and/or temperature dependent, input signal dependent, and other linear and non-linear distortions which could not be addressed by the memoryless DPD functions of the prior art.

The prior art "memoryless" predistortion blocks implement what may be described as a "0th order" filter. That is, in prior art predistortion approaches, the output depends only on the present inputs. In contrast, it has now been advantageously discovered that a fully adaptive correction that allows non-sequential ordering of the polynomial taps or delays, and that allows higher order polynomials, is beneficial. The use of such filters in linearizing amplifiers using a predistortion approach is described in a thesis paper authored by Roland Sperlich, "Adaptive Power Amplifier Linearization by Digital Pre-Distortion with Narrowband Feedback using Genetic Algorithms", presented August 2005, to the Georgia Institute of Technology School of Electrical and Computer Engineering. The paper applies genetic algorithm approaches to determining the polynomials for a DPD function that is an Nth order polynomial.

To optimize the polynomial selected for the short DPD block for a particular application, the non-linear representation chosen may be determined by simulation and modeling, and by using alternate inputs in the feedback methodologies. Examples include using the slope of the input signal, temperature of the system, etc. The use of an Nth order derivative of the signal could also be considered in determining the non-linear representation which is implemented in the short DPD. Because the short DPD block of the present invention, as depicted in FIG. 7, has variable delay between the filter taps, it can be configured to implement polynomials of various orders. It has been determined that the use of nonsequential, odd ordered polynomials is beneficial. In one example the 1st, 3rd and 5th orders were used to implement the short DPD filter 207. In operation, the Volterra function 207 may for example address distortion effects that are of durations of less than tens or hundreds of nanoseconds, in an amplifier system.

Figure 8:
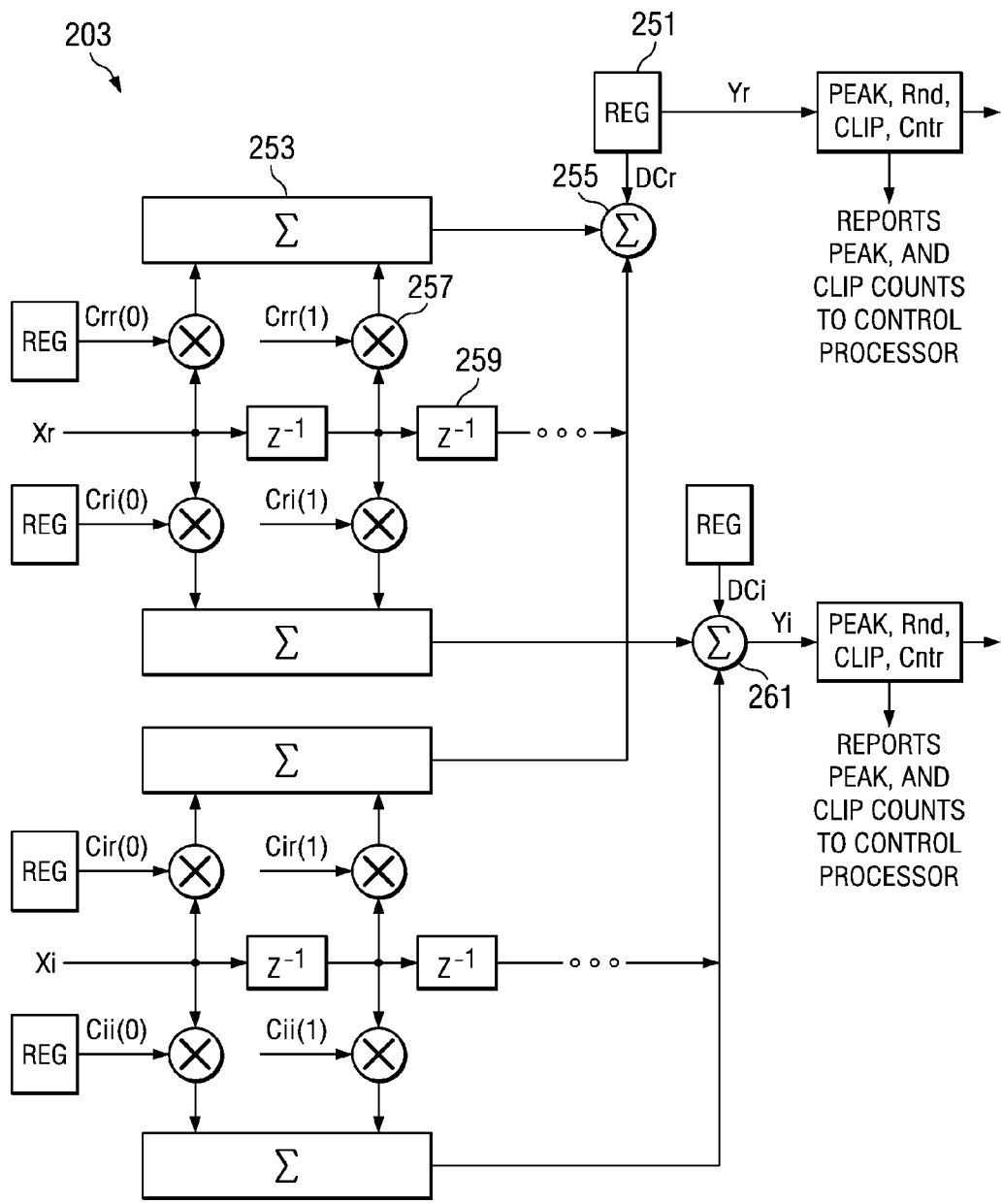
FIG. 8 is a block diagram of a preferred embodiment of an equalizer that may preferably be incorporated into the novel transmit processor of FIG. 6, and in particular into the short DPD block of FIG. 7.

FIG. 8 depicts a detailed block diagram of a preferred embodiment of the FIR Equalizer 203. In this preferred embodiment, four parallel filter stages 253 are used to implement an equalizer that can account for imbalances in the real (I) and complex (Q) signals and because the summer blocks 255 and 261 receive the "cross" terms from the complex (for summer 255) and real (summer 261) signals, the summers have weights stored in registers 251, the equalizer can address these imbalances and can address frequency dependent imbalances in the gains for the two signal streams. This equalizer thus provides advantages not found in the equalizers of the prior art. Although other known equalizers could be used in the system of FIG. 6, this equalizer is a preferred embodiment.

The block of FIG. 7 receives an input signal conditioned by the summer 89 of FIG. 6, which applies the output of the QRD block to the output of the "long memory" block. After the additional application of the Nth order polynomial 207 of FIG. 7, the short DPD function then applies equalization to the signal, the signal is interpolated and formatted for presentation to the non-linear analog RF circuit and amplifier, the output signal $V_{FF}$ is then output to the amplifier and associated analog circuitry such as 41 in FIG. 1.

The QRD block tracks non-linear distortion effects of longer duration, for example, greater than 1 microsecond. The QRD block fills in and tracks effects between adaptive updates, for example in a particular application the control processor 73 of FIG. 6 is a DSP that updates the parameters approximately every 100 milliseconds, the QRD block is designed to track the non-linear distortion in the power amplifier between these updates.

Figure 9:
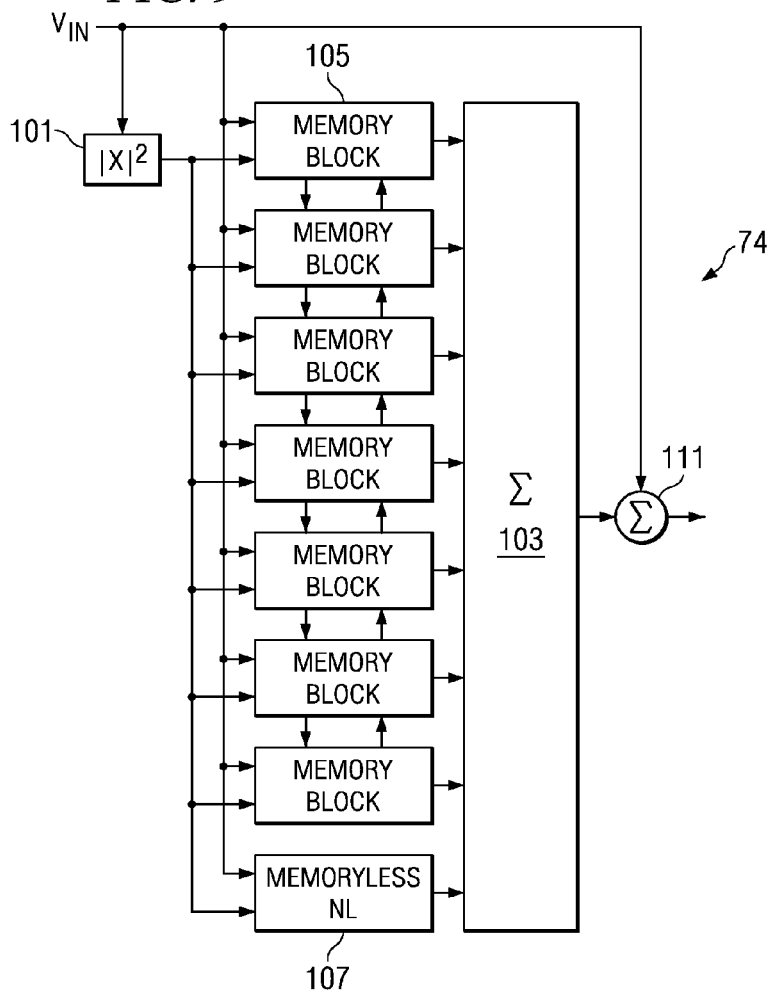
FIG. 9 is a block diagram depicting the long memory DPD functions of a preferred embodiment of the transmit processor of FIG. 6.

FIG. 9 depicts a detailed view of the long memory DPD block 74 of FIG. 7. In FIG. 9, an input I, Q form signal is coupled to the parallel cascade arranged memory blocks 105, which are described in further detail, below. The input is simultaneously coupled to the magnitude squared function ($|X|^2$) 101, which in this example embodiment outputs the complex magnitude as a result. In the illustrative embodiment of FIG. 13, the long DPD block has identical seven complex sections 105 coupled in parallel and further coupled to one another simpler stage 107.

The memoryless non-linearity block 107 is just a simpler form of the memory blocks 105; in an exemplary embodiment this block provides only a delay. The output signals from these eight functional blocks 105 and 107 are coupled to a summer or combiner function 103. The output of this summer block is then applied by signal combiner 111 to the input baseband data. The resulting weighted signal is then appropriately scaled and clipped to provide an output which is coupled to the summer 89 in FIG. 6, where it is combined with the output of the QRD block 95 in FIG. 6.

Thus, in the preferred embodiment of FIG. 9, the present invention provides a configurable "long memory" block that may implement a variety of filter functions depending on how the memory blocks 105 and 107 are configured. The long memory block implements a Hammerstein model filter, which as is known in the art models nonlinearities followed by a linearity. The implementation used in the preferred embodiment in FIG. 9 is a parallel form Hammerstein filter, each stage 105 is identical and the parallel operation of these blocks forms the overall function, the outputs are then summed together by summer 103. In operation in a known system for predistortion to linearize a power amplifier, the long memory block addresses non-linear distortions that are of duration of between hundreds of nanoseconds and one microsecond.

Figure 10:
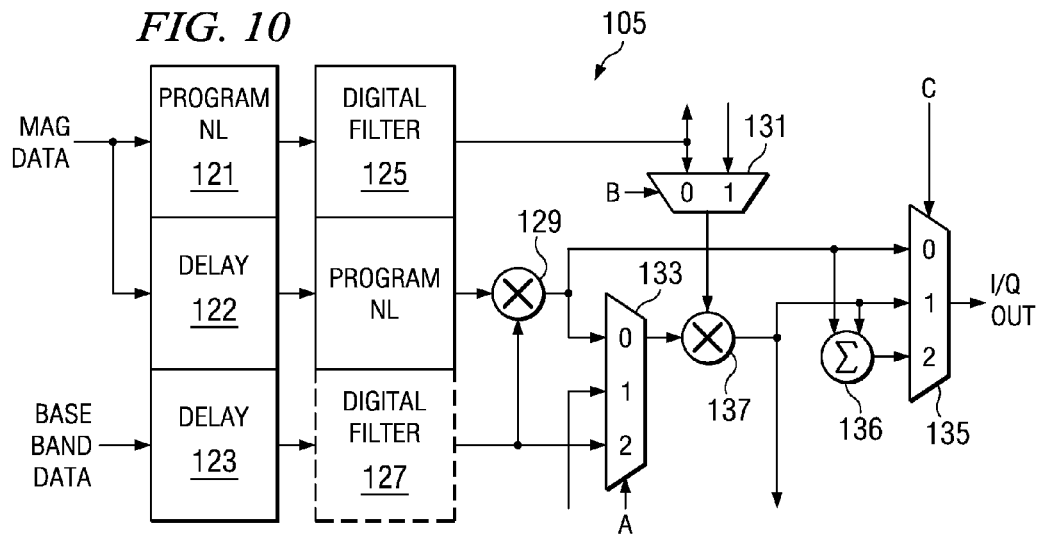
FIG. 10 is a block diagram of a preferred embodiment of the combined mode memory block, several of which are used together in the long memory DPD block of FIG. 9.

FIG. 10 depicts a preferred embodiment for an implementation of each instance of the memory block 105 of FIG. 9. In FIG. 10, the output of the magnitude squared function 101 in FIG. 9 (labeled Mag Data) is input to a programmable nonlinearity 121, and to delay element 122. The baseband data (labeled BB data) is input to a second delay 123. The output of the programmable nonlinearity 121 is coupled to digital filter 125, which in one example is an FIR (finite impulse response) filter implemented in a manner known in the art. The delayed magnitude squared data is input into a second programmable nonlinearity, in some preferred embodiments this is implemented as a programmable look up table or LUT. The delayed baseband data is optimally also input into another digital filter 127, in a preferred embodiment of the invention this is also a finite impulse response (FIR) filter.

Signal combiner 129 is then used to combine certain of these outputs. The combined mode block 105 includes three multiplexers 131, 133 and 135, each of which can select between inputs based on control signals A, B and C. Multiplexer 133 receives a control input 'A' and an input from another adjacent memory block 105 positioned adjacent the one illustrated (not visible), an input from the digital filter 127, and an input from the combiner 129. Multiplexer 131 selects, based on the control signal B, between the output of filter 125, and an input from an adjacent memory block 105 shown located adjacent the one illustrated (not visible). The output of FIR 125 is also made available as an output of the memory block 105. Signal combiner 137 combines the outputs of the two multiplexers 131, 133. The output of the combiner 137 is provided as one output of the memory block 105 and to one of the inputs of multiplexer 135, which is controlled by control signal C. The other inputs of multiplexer 135 are the output of signal combiner 129, and the output of summer 136. The output of the multiplexer 135 is selected based on the control signal C and the output of the multiplexer 135 is then the output of the memory block 105.

By selecting different inputs for each of the multiplexers 131, 133 and 135, different forms of memory block 105 may be programmably created within the long block memory parallel function 74 of FIG. 6. These different forms provide different filter forms for the long DPD or "memory" blocks 105. The present invention thus provides a memory or long digital predistortion block that can, with software changes to provide the required control signals A, B and C from the control processor, implement different functions without the need for hardware modifications. Thus the functionality of the long digital predistortion feature can be modified by use of the control signals.

Figure 11:
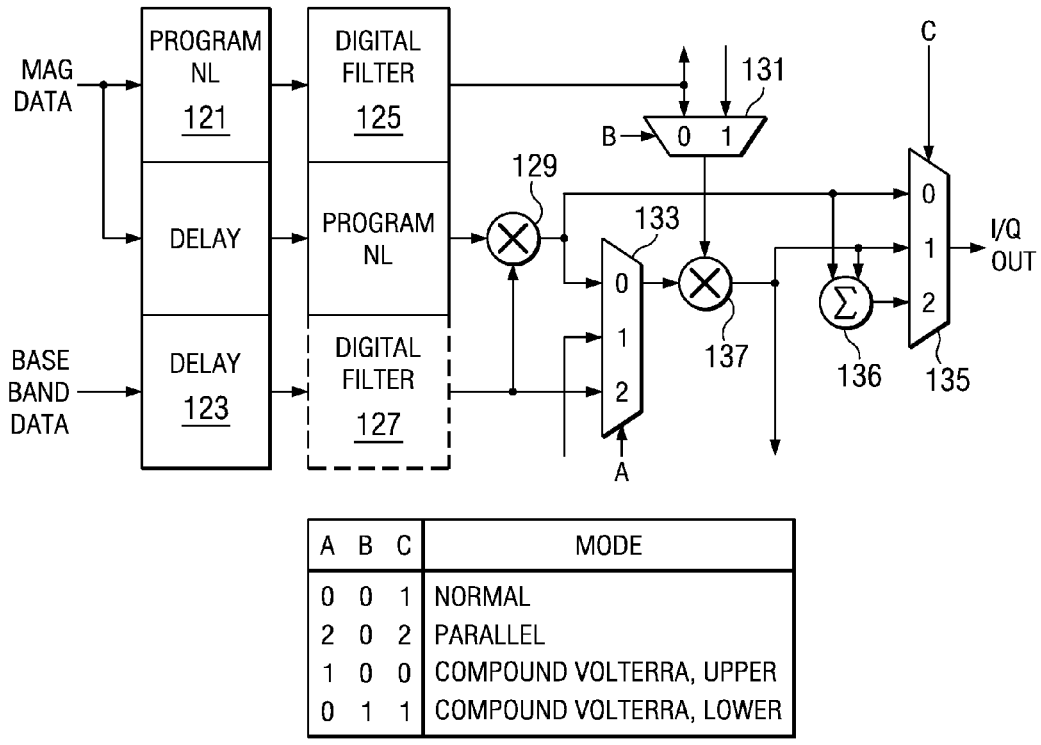
FIG. 11 depicts a block diagram illustrating the combined mode memory block of FIG. 10 and depicts a table showing control input values for different possible modes of operation.

As exemplary preferred embodiments, FIG. 11 depicts the memory block 105 of FIG. 10 using the same reference numerals and illustrates in a table form the use of the control signals A, B and C to form three different selected forms of the combined mode long memory block 105, these blocks may then form filters that may be selectively used in a preferred embodiment. Each form of the "long memory" shown in FIG. 10 may be selected by programming the control processor to provide appropriate selection signals A, B and C to the combined mode memory block and coupling the adjacent blocks together. In a given application, certain instances of the memory block 105 that are used may or may not use all of the available input and output ports, as will be obvious from examining the block diagrams in FIGS. 12-15. For example, the uppermost or lowermost block 105 in a parallel grouping may not use these ports.

Figure 12:
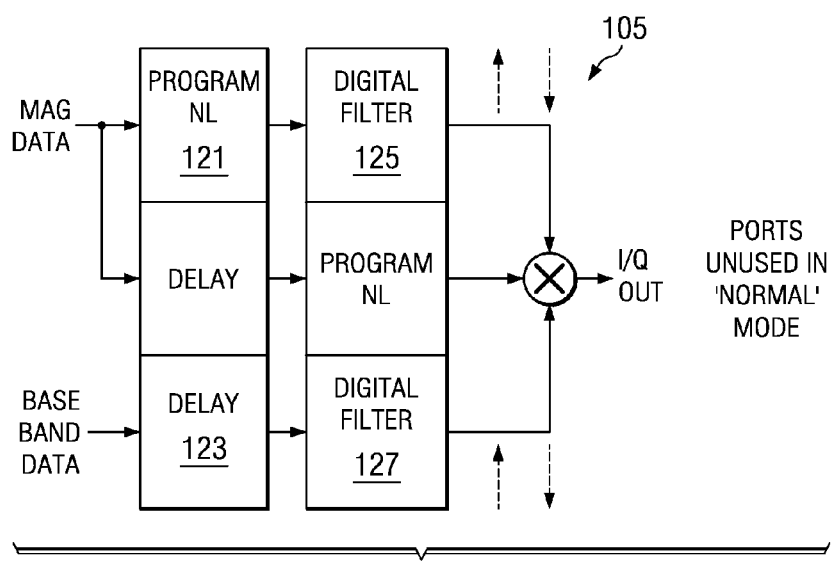
FIG. 12 is a graphical representation of the combined mode memory block used in the long DPD block of FIG. 9 when configured in a first preferred mode, the normal mode.

FIG. 12 illustrates the configurable memory block 10S of FIG. 10 when configured in a first mode of operation for use as a long term or "memory" predistortion function, for example in the application depicted in FIG. 9. In FIG. 12, the block or 105 is configured with each stage having the multiplexers 131, 133 and 135 and the control signals A, B and C are set such that the resulting block is arranged as shown, with magnitude squared data is input to a programmable nonlinearity block 121, and delay element 123, the baseband input data is directly input to a delay element 123, these blocks are coupled to a digital filter preferably implemented as a multiple stage FIR filter 125, a second programmable nonlinearity and a second digital filter 127 which in one preferred example is implementing a 3 tap FIR the outputs of these blocks are then combined and the final data output is presented as I and Q digital outputs.

Figure 13:
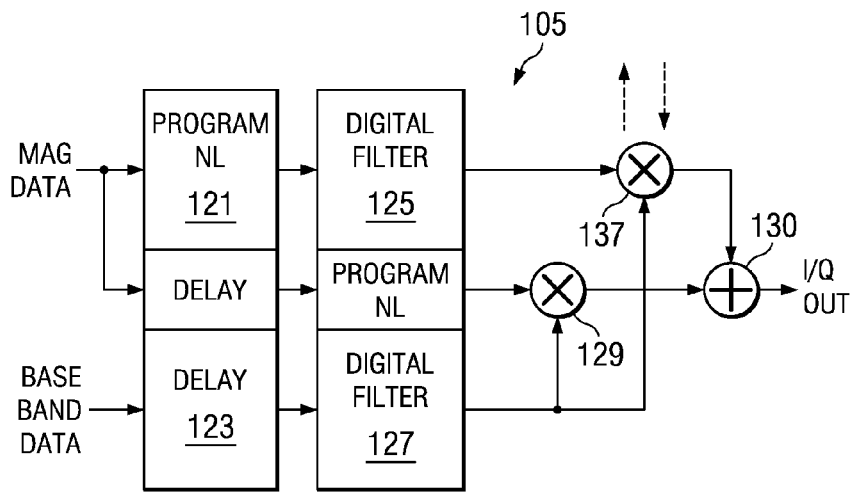
FIG. 13 is a graphical representation of the combined mode memory block used in the long DPD block of FIG. 9 when configured in another preferred mode, the parallel mode.

FIG. 13 depicts, similarly, the result of the settings of the control signals A, B and C to the multiplexer 131, 133 and 135 to combine the outputs of convolver 129 and 137 so as to configure the memory block 105 of FIG. 10 to create the "parallel" mode arrangement shown. Here the magnitude squared data is input to the programmable nonlinearity block 121, a delay element, and baseband data is input to delay element 123, these are then output in parallel to the digital filter 125, which is preferably a multiple stage FIR filter, a second programmable nonlinearity block, and the applied and the outputs summed at summer 130, and the block output is I and Q form digital data.

Figure 14:
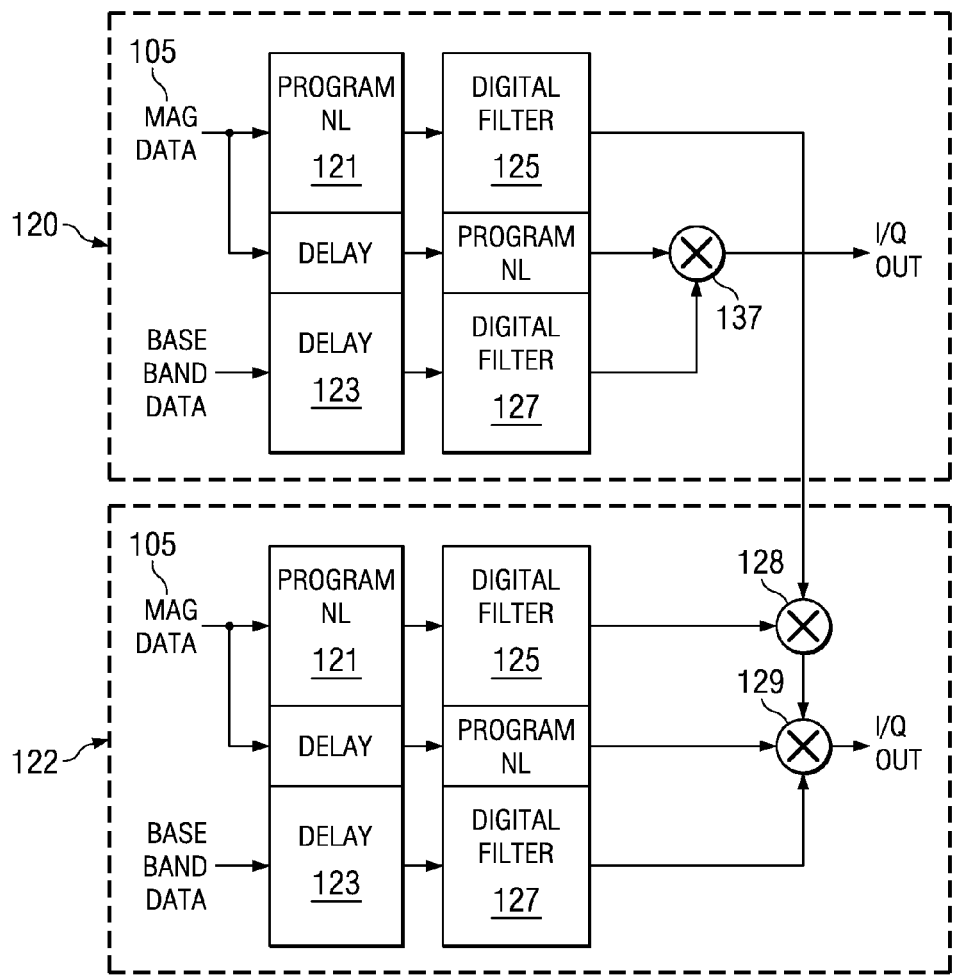
FIG. 14 is a graphical representation of the combined mode memory block used in the long DPD block of FIG. 9 when used in yet another preferred mode, the compound Volterra mode.

FIG. 14 depicts the use of two of the cells 105 of FIG. 10 arranged together and with the multiplexer controls set so as to form a long DPD block that is a compound Volterra mode filter cell. The use of two cells communicating to form the Volterra mode filter is an application of the principles of "parallel cascade" form; it is known that for certain filters the stages may be arranged as a "parallel cascade" form in pairs of stages. In applying this form to the combined mode memory block 105, the blocks are configured using the input port of the multiplexer 131 in FIG. 11 (not shown in FIG. 14) to couple the top cell to the bottom cell so that together they are arranged to form a filter block that operates in a compound Volterra mode. The "parallel cascade" form is further described, for example, in the book "Polynomial Signal Processing", pp. 97-98, which is hereby incorporated by reference. Other arrangements are possible using the configurable block 105 and the control signals A, B, C to form the individual filter blocks of FIG. 10.

Figure 15:
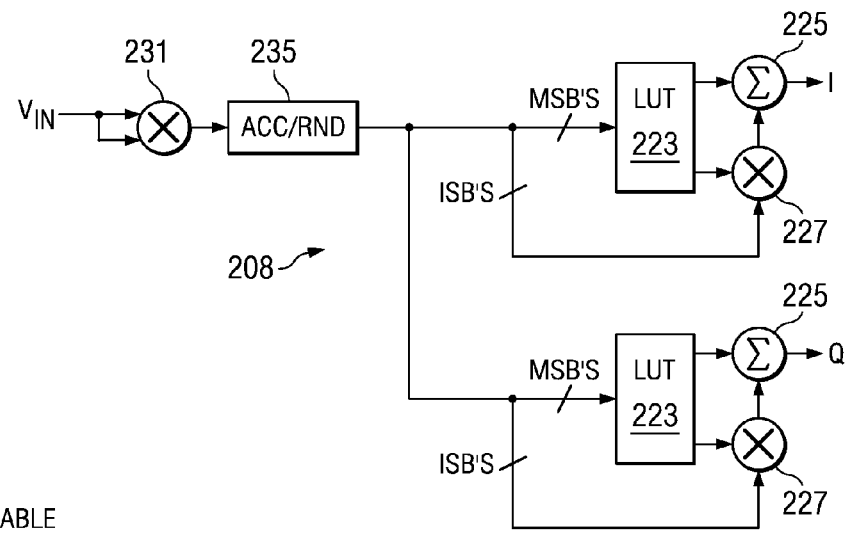
FIG. 15 is a block diagram illustrating an exemplary implementation of a programmable nonlinearity based on a look up table as used in the various preferred embodiments of the invention.

Additional blocks of FIG. 6 are required to implement the remaining functions of the transmit processor implement functionality. For completeness a short description of possible implementations of certain of these blocks is presented here, FIG. 15 illustrates one preferred embodiment of a magnitude squared block and a corresponding interpolating programmable look up table ("LUT") 208. These functional blocks are used to implement the programmable nonlinearities or LUT's described above in various blocks. The input data for example $V_{IN}$ is received in I,Q form. To detect the magnitude squared, the data is multiplied by itself in multiplier 231, and then the output data is accumulated and rounded to the appropriate number of bits in accumulator 235. The magnitude data is then used to address the look up tables 223. In a preferred embodiment the look up tables or LUTs 223 are implemented using interpolation techniques. The most significant bits (MSBs) are used to determine a first table entry point. The least significant bits (LSBs) are then again used to address the table to obtain a slope between entry points. This output is combined with the LSBs to determine distance along the non-linear slope between entries that is to be calculated, this value is added to the discrete table entry, and this data is output as the programmable nonlinearity. When the various blocks are parameterized by the control processor 73 in FIG. 6, or when the blocks are adaptively updated during operation of the system, these values may be changed to change the behavior of the blocks. In one preferred implementation, for this LUT function, the input is for example a 17 bit wide digital signal, the 7 most significant bits (Mob's) are used to address the entries in the table, and the 10 least significant bits (Labs) are used to interpolate for values that lie between the table entries, in one illustrative example the table has 128 words which are 16 bits wide, these are combined with the interpolation function of the multiplier 227 and the summer 225 to provide a 16 bit output. This is done for both I and Q input signals and the outputs are I and Q form signals.

Figure 16:
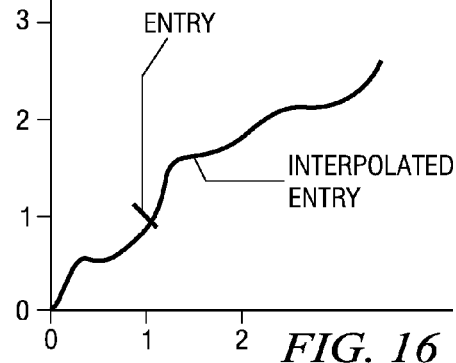
FIG. 16 is a graph illustrating an example of the operation of a programmable nonlinearity implemented as an interpolating look up table as depicted in FIG. 15, with interpolation between two look up table entries along a non-linear curve depicted.

FIG. 16 illustrates, for a simple example, how the interpolation of the look up tables illustrated in the preferred embodiment of FIG. 15 operates. In this example, the table entry located by the most significant bits would be "1, 1", and the slope and magnitude indicated by the remaining look up and the combination of the slope and the Lab's would locate a point along the non-linear curve between table entries 1, 1 and 2, 2, summer 225 of FIG. 15 adds to the distance and slope to locate the final point indicated by that particular input.

Figure 17:
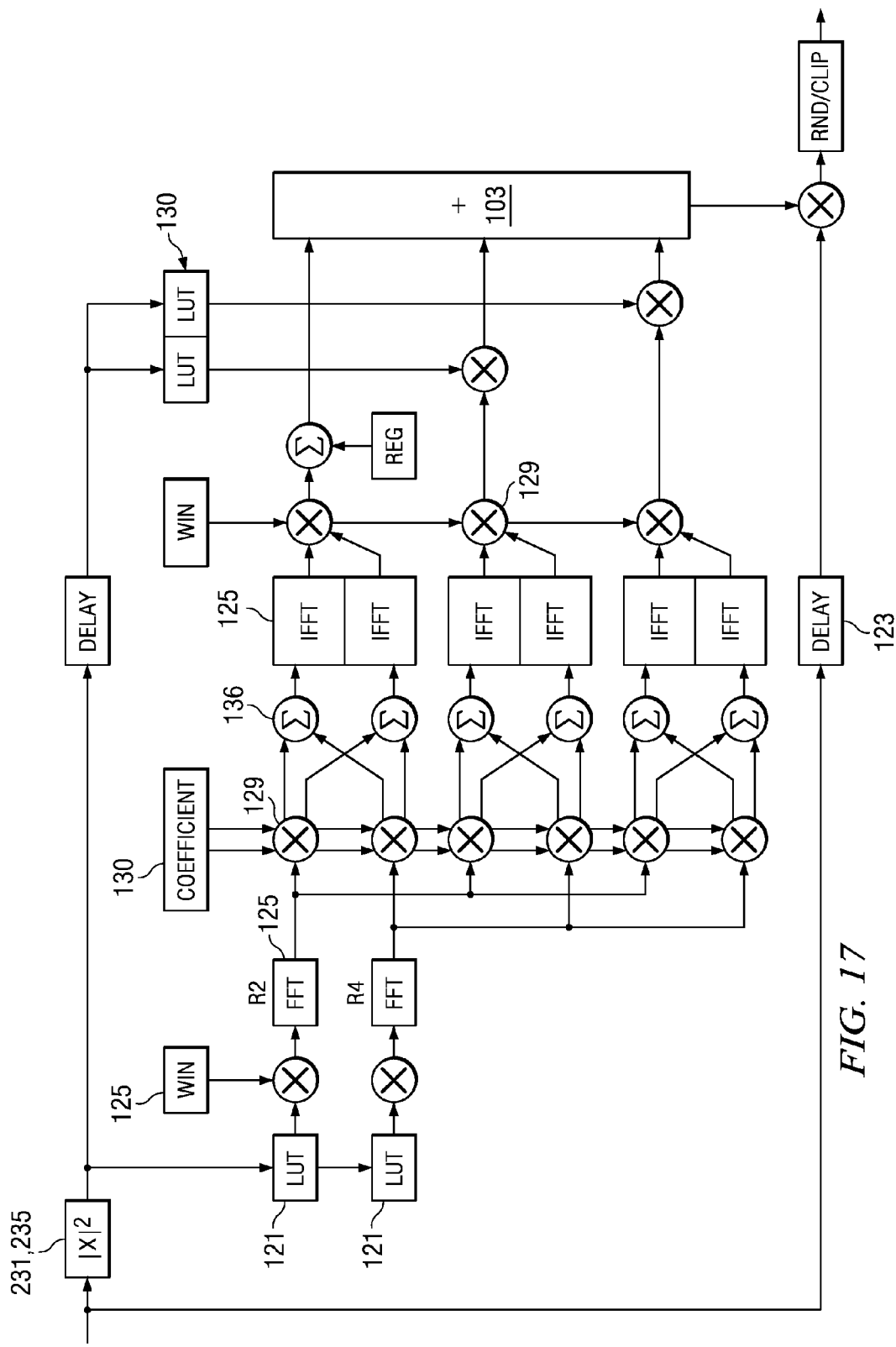
FIG. 17 is a block diagram illustrating an exemplary preferred implementation of the long memory block function of FIGS. 6 and 9 using a plurality of the combined memory blocks of FIG. 10 configured in a preferred manner.

FIG. 17 depicts a detailed view of an exemplary long block implementation using several of the combined mode memory blocks 105 of FIG. 10 coupled together and redrawn without showing the unused multiplexers or ports. This exemplary parallel Hammerstein filter embodiment implements a frequency domain convolution using FFT and IFFT transforms to perform the convolution in the frequency domain, and then return the results to the time domain, as is known in the art. The block shown FIG. 17 thus provides a complex FFT and convolution in ½ the real space. The various blocks are numbered referencing the sub blocks used in the combined memory block functions 105 to form the long block function of FIG. 17. In FIG. 17, the exemplary embodiment of a magnitude detection block may be used, for example, to implement the $|x|^2$ functions and the rounding functions, as shown in the previous figures; blocks 231 and 235 of FIG. 15 are preferably used. The look up table or LUT blocks of FIG. 17 represent the use of the blocks 121, or 130, of the combined mode memory blocks which are programmable nonlinearities configured as look up tables such as shown in FIG. 15. The multiplier functions 129 and summing functions 136 are those parts of respective ones of the combined mode memory blocks. Summer 103 is the same as the one depicted in the general case long DPD block 74 of FIG. 9. By coupling several of the combined mode memory blocks together and using the various functions of those blocks, a real x real FIR filter is configured as shown in FIG. 17, with FFT and inverse FFT transforms being performed to enable a convolution as is known in the art.

In addition to these blocks, the preferred transmit processor embodiment of the present invention illustrated in FIG. 6 also requires QRD block 95. The QRD block provides a hardware predistortion function that operates in real time, and this block outputs a synthesized error based on the feedback error and the current inputs, to address certain distortion effects that are of longer time duration. Because the feedback loop through the feedback path 40 in FIG. 7 is long, the QRD block addresses distortion effects that are approximately 1 microsecond or greater in duration. The output of this block is an expected error that is subtracted from the output of the long DPD block as shown in FIG. 6.

The use of the present invention provides an improved digital predistortion function that may be used to adaptively linearizing a non-linear element, for one non limiting example, a power amplifier, for transmission of signals. The invention provides advantages by breaking the predistortion functions into several functional blocks, a long memory effect block, coupled to input baseband data, and a short memory effects block that receives the output of the long block combined with a QRD block, and receives feedback input from a prior non-linear element output. The approach of the invention is to model the error for each of the long or memory DPD and short DPD blocks. In a preferred method, the short DPD block and the non-linear amplifier are cascaded together and treated as another non-linear element, thus the approach to modeling and initializing the long DPD block of the invention treats the short digital predistortion function and power amplifier as a single non-linear element that may be linearized. The preferred embodiment of the short DPD is a polynomial of greater than 0th order, preferably having Nth order and the order may be non-sequential, and thus addresses short term or "memory" distortion effects, while the long DPD predistortion block addresses longer term or "memory" effects as well. Thus the system and methods of the invention advantageously provides a transmit processor and amplifier that is linearized including memory effects, such as thermal memory and the effects of prior input signals transmitted by the power amplifier, these are distortion effects that the prior art predistortion solutions cannot address.

The methods of the present invention include the use of software models to allow for "offline" parameterization of the system and ongoing adaptation of the parameters, for example the programmable nonlinearities used in the various predistortion blocks must be initialized and parameterized, and these parameters must be periodically updated, to maintain proper operation.

Figure 18:
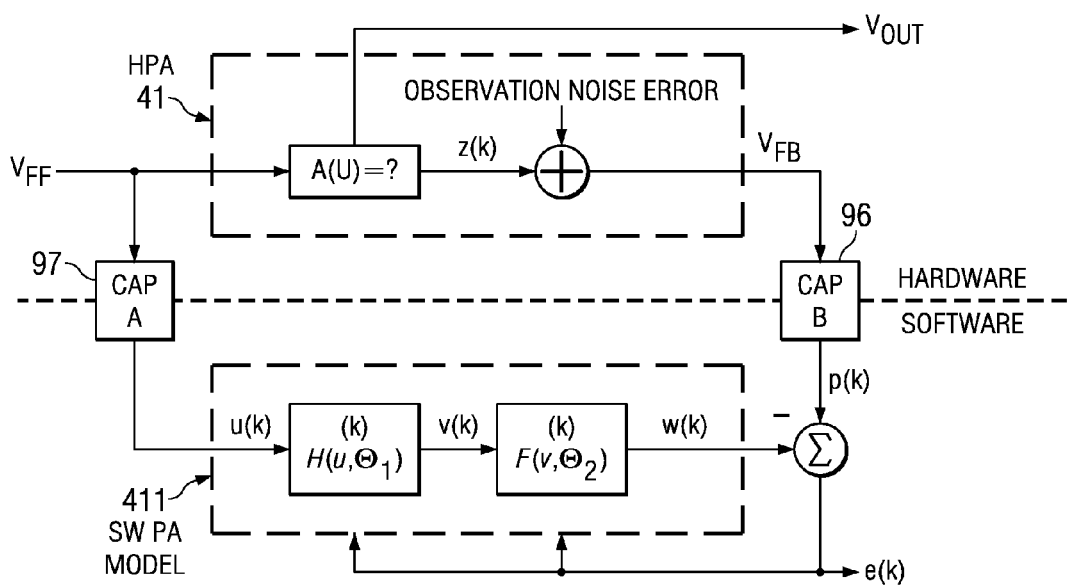
FIG. 18 depicts in block diagram form the hardware and software blocks used in a preferred method of the invention to develop, initialize and adapt the high power amplifier software model.

FIG. 18 illustrates a preferred approach to the development of the model for the power amplifier or software PA model. The models assume that there is little known about the amplifier initially, however, it is assumed that the power amplifier (or other non-linear systems) can be effectively modeled by a Wiener model, that is as is known in the art, a linearity in cascade with a nonlinearity. In FIG. 18 the software model for the power amplifier 41 is illustrated, for simplicity, as a functional block numbered 411. In order to adapt the model, the capture buffers CAP A 97 and CAP B 96 are configured, (preferably using multiplexers to select the inputs) to allow a comparison of the data $V_{FF}$ placed at the input to the power amplifier 41 and the feedback data $V_{FB}$ observed by the system. These data points are used to optimize the model so that the output w(k) from the model 411 is exactly adapted to match the sampled data p(k) observed by the capture buffer B, in other words, the model is adapted to minimize the error signal e(k).

In operation, this block must first be modeled, then initialized at an estimated starting state, and the parameters calibrated, the parameters must be determined, and then the parameters are adapted during operation of the high power amplifier to validate the model. The discussion that follows details each of these steps for a preferred method of the modeling operation; however the order of the steps may be varied as is obvious to one skilled in the art.

The first stage in a preferred method is to model the high power amplifier HPA in software. Before the software modeling is done, the initial gain levels must be set up so that the overall system gain is compatible with any crest factor reduction (CFR) circuitry that is used ahead of the digital predistortion blocks of the present invention. The gain of the high power amplifier is assumed The goal is to model the power amplifier using a least squares objective function. The power amplifier is initially unknown but is assumed to be well represented with a Weiner model, which is a linear filter followed by a memoryless nonlinearity. The linear filter can be considered as H(z) and the memoryless nonlinearity as F(v), so the model is, starting with the input u(k) as baseband digital data, the output of the linear filter is given by:

$$v(k)=H(u(k),\theta_1).$$

This sequence drives the nonlinearity so that $$w(k)=F(v(k),\theta_2).$$

Thus the combined cascade function for the Wiener model is then:

$$w(k,\theta)=F(H(u(k),\theta_1),\theta_2).$$

The model is illustrated graphically in FIG. 18 as block 411 shown in parallel with the actual power amplifier PA. The characterization process is to compare the actual power amplifier (including observation error) as captured by the memory block Cap B (96) to the software model and the difference, or error e (k) is then to be minimized. That is, the goal is to correctly model the power amplifier so that for any input u (k) the model output w (k) is equal to the power amplifier observed output p (k).

From FIG. 18 it can be seen that the cost function objective of the modeling process is to minimize the mean squared error (determine the MMSE) between the model and the output of the actual power amplifier, for the same stimulus u (k). The cost function C can be $$C(\theta) = \sum \|p(k) - w(k, \theta)\|^2$$
$$= \sum \|p(k) - F(H(u(k), \theta_1), \theta_2)\|^2$$

Where $$\theta = \begin{bmatrix} \theta_1 \\ \theta_2 \end{bmatrix}$$

or, $$e(k, \theta) = p(k, \theta) - w(k, \theta)$$

expressed as:

$$E(k, \theta) = [e(k, \theta)e(k+1, \theta)e(k+2, \theta)\ldots]^T$$
$$U(k) = [u(k)u(k+1)u(k+2)\ldots]^T$$
$$V(k) = [v(k)v(k+1)v(k+2)\ldots]^T$$
$$W(k) = [w(k)w(k+1)w(k+2)\ldots]^T$$
$$C(\theta) = \|E(\theta)\|^2 = E^H(\theta)E(\theta)$$
$$\hat{\theta} = \min_{\theta} C(\theta)$$

In these equations, the modeling error is e(k, θ), the output of the power amplifier including observation errors is p(k, θ), and the output of the software model is w(k,θ). The parameter value of this minimization algorithm is the maximum likelihood estimate of the parameters. It is known to use a Kalman filter as a method to compute an unknown system. A paper entitled "An Introduction to the Kalman Filter", by Greg Welch and Gary Bishop, TR95-041, Department of Computer Science, University of North Carolina at Chapel Hill, Jul. 24, 2006, describes the general Kalman filter, the discrete Kalman filter and the extended Kalman filter which is used for non-linear systems. In a preferred method, an extended Kalman filter is used to estimate the least squares solution of θ, as opposed to an approach that requires finding the value for θ that minimizes the magnitude $\|E(\theta)\|^2$. Further the use of an unscented Kalman filter is also known to be advantageous as the unscented Kalman filter is even better suited to solving for nonlinearities. Kalman filters are used for modeling unknown systems that are basically linear, the extended Kalman filter was created to address non-linear systems, but it essentially approximates the system as linear to a first order of approximation, so the unscented Kalman filter is known in the art for advantageous use with non-linear systems. The optimization criterion used is the least squares or LS criterion. One skilled in the art will recognize that there are many other possible objectives (other than LS) that one could choose as acceptable alternates, including mean squared error, RLS and the like.

In order to solve the cost function problem, it is first recognized that the problem is primarily a non-linear least squares minimization problem. While there are many known methods for solving for the LS solution to non-linear problems, in one embodiment a preferred method is to use the Gauss Newton method, due to its simplicity and ease of implementation.

In the formation of the problem a cost function C (θ) was defined.

Newton's method for non-linear equations is based on the linear approximation (for smooth functions or analytic)

$$C(\theta)=E^H(\theta)\cdot E(\theta)$$

Approximate
$E(\theta+\delta)$ using the first Taylor series term $$E(\theta + \delta) = E(\theta) + J(E(\theta)) \cdot \delta + O(\|\delta\|^2)$$

$$\hat{\theta} = \min_{\theta} C(\theta)$$

where the Jacobian is the matrix $$(J(E(\theta)))_{ij} = \frac{\partial E_i}{\partial \theta_j}(\theta)$$

$$J(E(\theta)) = \begin{bmatrix} \frac{\partial e_0}{\partial \theta_1} & \frac{\partial e_0}{\partial \theta_2} & K & \frac{\partial e_0}{\partial \theta_M} \\ \frac{\partial e_1}{\partial \theta_1} & \frac{\partial e_1}{\partial \theta_2} & \Lambda & \frac{\partial e_1}{\partial \theta_M} \\ M & M & & M \\ \frac{\partial e_N}{\partial \theta_1} & \frac{\partial e_N}{\partial \theta_2} & K & \frac{\partial e_N}{\partial \theta_M} \end{bmatrix}$$

The above can be repeated for an iterative solution and yield.

With some algebra the iterative solution can be given as Let, $$\delta^k = \theta^{(k+1)} - \theta^{(k)}$$

initialize $\theta^0$, for $k = 0, \ldots$

Compute $J(E(\theta^k)), E(\theta^k)$

Solve $\min_{\delta} \|J(E(\theta^k))\delta^k - E(\theta^k)\|^2$ $\theta^{k+1} = \theta^k + \delta^k$ next $k$ return $\theta$ Using this method the standard LS solver can be used for $$\left[ \text{Solve} \min_{\delta} \|J(E(\theta^k))\delta^k - E(\theta^k)\|^2 \right]$$

which is the majority of the computation. These iterations improve the estimate as long as $|E(\theta^{k+1})| < |E(\theta^k)|$ holds.

Now that the basic framework has been outlined for how to find the model parameters iteratively two elements are required to implement the algorithm. An initial starting point $\theta^{(0)}$ is required. If this initial starting point is too far away from the desired solution the linear approximation used does not hold with sufficient accuracy to converge. The second issue is the need to compute the Jacobian of the error E.

The first step in the generation of the PA software model is to estimate the best least squared phase, gain and delay that matches the PA. This is done by capturing data at the input to the PA and the output using the capture buffers CAP A 97 and CAP B 96 of FIG. 18. Alternatively, only a signal capture buffer can be used for the feedback signals, the signals into the non-linear power amplifier could be captured in another resource such as by an external computer. Assuming that the complex representation of the power amplifier is the vector x and its output is the vector y, the cross correlation is between the vectors is computed. The point where the maximum magnitude is used to find the PA and associate hardware delay. After the delay has been normalized the complex gain at that delay is found.

The model has a non-linear and a linear block in cascade. The first step in initializing the model is to initialize the linear block. This is performed by setting the non-linear block to a "pass through" and then the linear filter is determined in a typical linear system identification method. The traditional LS solver can be used. Using the Matlab tools as are known in the art, the output of the power amplifier 41 of FIG. 18 may be represented:

Function [gain, delay]=HPA_init(x,y)z=corr(x,y);
ind=find(max(abs(z))==abs(z));
delay=ind(1)−length(x);
gain=z(ind(1))/(x'*x);
return From these values the coefficients of H (u) in FIG. 18 are set. After the initial guess of a coarse model for the power amplifier, the required nonlinearity F (v) is found. The input to the model nonlinearity is found by convolving the power amplifier input data by the linear model H (u) just computed, (V=U*H). From this convolution, an estimate of F (v) is generated. Preferably a least fit, similar to the polyfit in Matlab, may be used.

Next the non-linear portion of the high power amplifier is initialized.

The cost function C ($\theta$) to be minimized can be stated as Let, $$P = [p(0), p(1), \ldots]^T$$

$$T_1 = \begin{bmatrix} v(0)B_0(\|v(0)\|^2) & v(0)B_1(\|v(0)\|^2) & v(0)B_{M-1}(\|v(0)\|^2) \\ v(1)B_0(\|v(1)\|^2) & v(1)B_1(\|v(1)\|^2) & \\ & & \\ v(N-1)B_0(\|v(0)\|^2) & & v(N-1)B_{M-1}(\|v(N-1)\|^2) \end{bmatrix}$$

$$E(\theta_2) = T_1 \theta_2$$

$$E = P - T_1 \theta \quad \text{Standard } LS \text{ problem}$$

It should be noted that the valid size of the vector v is less than the capture buffer size due to end effects on the convolution V=U*H. At this point the coefficients of H only have 1 non-zero value.

The next step is to compute the vector E (θ) and the Jacobian E' (θ). The vector E (θ) is easily computed using the Weiner model and the parameters vector θ and is not discussed further. A critical step needed above is how to best compute the Jacobian required.

This is easily accomplished by applying the chain rule and is:

$$\frac{\partial E(\theta_1, \theta_2)}{\partial \theta_1} = \frac{\partial V}{\partial \theta_1} \frac{\partial W}{\partial V}$$

$$\frac{\partial E(\theta_1, \theta_2)}{\partial \theta_2} = \frac{\partial W}{\partial \theta_2}$$

$$E'(\theta) = J(E(\theta)) = \left[ \frac{\partial E(\theta_1, \theta_2)}{\partial \theta_1} \frac{\partial E(\theta_1, \theta_2)}{\partial \theta_2} \right]$$

From this it can be seen that the Jacobian of several blocks with different associated input/output relations is required.

Computation of the Jacobian for the linear filter H (u).

From FIG. 18 it is seen that H is a simple FIR filter so computing the partial derivative of the output relative to the coefficients is easy. This is can be seen from $$v(k) = \sum_{i=0}^{N} \theta_1(i) * u(k-i)$$

$$\frac{\partial v(k)}{\partial \theta_1(i)} = u(k-i)$$

$$T_1 = \frac{\partial V(k)}{\partial \theta_1} = \begin{bmatrix} u(k) & u(k-1) & \Lambda & u(k-N+1) \\ u(k+1) & u(k) & \Lambda & u(k-N+2) \\ M & M & & M \\ u(k+M-1) & u(k+M-2) & \Lambda & u(k+M-N) \end{bmatrix}$$

The Jacobian is also required for F (v), the nonlinearity. The nonlinearity F(x) selected is slightly more difficult to differentiate with respect to the input as needed for $$\frac{\partial E(\theta_1, \theta_2)}{\partial \theta_1} \text{ from } \frac{\partial F(v)}{\partial v}$$

This is found by reapplying the chain rule as $$w(x) = v \cdot \sum_{i=0}^{N-1} b_i B_i(\|v\|^2)$$

$$\frac{\partial F(v)}{\partial v} = w'(v)$$

$$= \sum_{i=0}^{N-1} b_i B_i(\|v\|^2) + v \cdot \sum_{i=0}^{N-1} b_i B'_i(\|v\|^2) \frac{\partial \|v\|^2}{\partial v}$$

-continued $$T_2 = \begin{bmatrix} \frac{\partial F(v(0))}{\partial v(0)} & \frac{\partial F(v(0))}{\partial v(1)} & \Lambda \\ \frac{\partial F(v(1))}{\partial v(0)} & \frac{\partial F(v(1))}{\partial v(1)} & \Lambda \\ M & M & \\ & & & \frac{\partial F(v(N-1))}{\partial v(N-1)} \end{bmatrix}$$

but since $F(v)$ is memoryless $T_2$ is diagonal $$T_2 = \begin{bmatrix} \frac{\partial F(v(0))}{\partial v(0)} & 0 & \Lambda & 0 \\ 0 & \frac{\partial F(v(1))}{\partial v(1)} & \Lambda & 0 \\ M & M & & \\ 0 & 0 & & \frac{\partial F(v(N-1))}{\partial v(N-1)} \end{bmatrix}$$

The computation of the Jacobian of F (v) with respect to the signal input is also required. This presents a bit of an issue since $d\|x\|^2/dx$ is not complex differentiable. A solution to this problem is to premultiply both sides by conj(x)/abs(x) so that the right hand side of the equation becomes real and the problem is avoided. The solution to the transformed system provides the same result since the magnitude of x has not changed and the gradient relative to the parameters remain the same. By using the substitution Let, $$\tilde{w} = w \cdot \frac{v^*}{|v|}$$

$$\tilde{v} = |v|$$

and $$\tilde{w}(v) = \tilde{v} \cdot \sum_{i=0}^{N-1} b_i B_i(\|\tilde{v}\|^2)$$

$$T_2(k, k) = \tilde{w}'(v(k))$$

$$= \sum_{i=0}^{N-1} b_i B_i(\|\tilde{v}(k)\|^2) + 2\tilde{v}^2 \cdot \sum_{i=0}^{N-1} b_i B'_i(\|\tilde{v}(k)\|^2)$$

Since $\tilde{v}$ is now strictly real, the required differentiation can be applied and transformed back to the original domain if necessary.

The last term needed is $dW/d\theta$ but this quantity was derived in the initialization section as:

$$T_3 = \frac{\partial W}{\partial \theta_2}$$

$$= \begin{bmatrix} v(0)B_0(\|v(0)\|^2) & v(0)B_1(\|v(0)\|^2) & v(0)B_{M-1}(\|v(0)\|^2) \\ v(1)B_0(\|v(1)\|^2) & v(1)B_1(\|v(1)\|^2) & \\ & & \\ v(N-1)B_0(\|v(0)\|^2) & & v(N-1)B_{M-1}(\|v(N-1)\|^2) \end{bmatrix}$$

In summary using the Tx matrices $$\frac{\partial E(\theta_1, \theta_2)}{\partial \theta_1} = \frac{\partial V}{\partial \theta_1} \frac{\partial W}{\partial V}$$

$$T_1 = \frac{\partial V}{\partial \theta_1}$$

$$T_2 = \frac{\partial W}{\partial V}$$

$$\frac{\partial E(\theta_1, \theta_2)}{\partial \theta_2} = \frac{\partial W}{\partial \theta_2}$$

$$T_3 = \frac{\partial W}{\partial \theta_2}$$

$$J(E(\theta)) = \left[\frac{\partial V}{\partial \theta_1} \frac{\partial W}{\partial V} \frac{\partial W}{\partial \theta_2}\right]$$

$$J(E(\theta)) = [T_1 \cdot T_2 \; T_3]$$

This method of computing $E'(\theta)$ is then used in the least squares solver to obtain $\theta$. It is noted that the matrix T2 is quite large (N×N) where N is the capture buffer size (minus truncated end effects) but since all of diagonal terms are 0, only the diagonal terms needs to be computed and saved. The other matrices have N rows, but the columns are small (equal to the affected parameter vector size M). T1 is Toeplitz that can be exploited to accelerate the computation if desired. T3 is a full N×M matrix that has no simple structure. Due to the structure issue with T3 no large gains in computational efficiency seems possible without significant changes to the approach.

Once the initial 'guess' for the power amplifier software model parameters 411 of FIG. 18 have been made, the Gauss-Newton method can be employed.

A method of tracking of the models is needed. There is a tradeoff between adaptation speed and forgetting helpful information in the DPD process. A validation process is used to validate the models; this is done by providing data to the system and observing the results using the capture buffers.

In the initialization of the HPA model higher order models can be used to reduce the error. However including these added terms leads to more computation and may be result in little or no improvement in performance. In this case some of the regressors are nearly collinear and a reduced subset of parameters can be used for nearly the same performance at reduced complexity. There are many techniques to achieve this goal and the penalized least squares (PLS) algorithm is probably the most widely used.

Finally, after the software PA model 411 is generated, the short DPD model is also initialized and adapted. The process for performing these steps is very similar to the steps described above for modeling the power amplifier. An approximate parameter solution must be found to initialize the non-linear optimization procedure.

Figure 19:
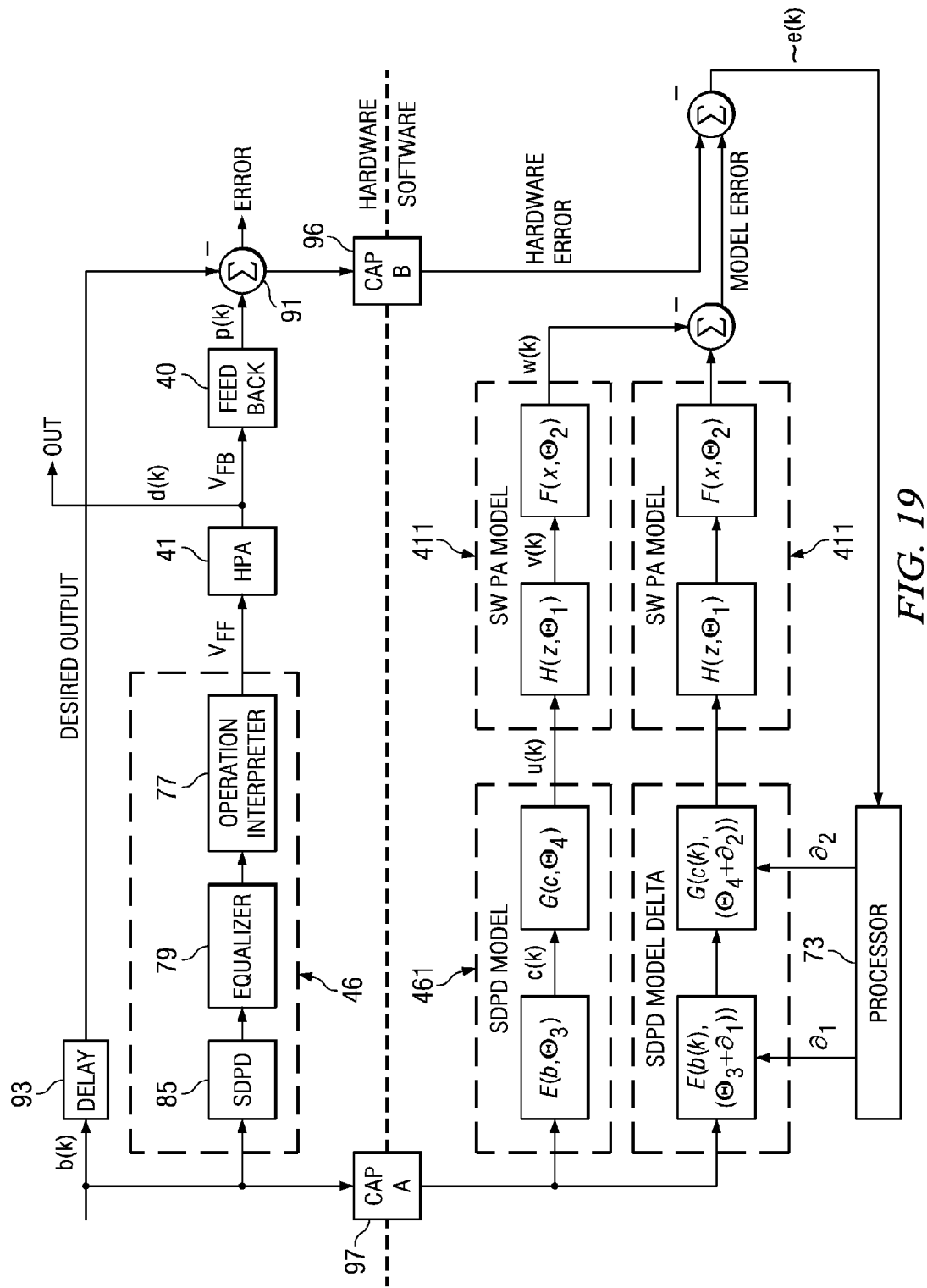
FIG. 19 depicts in block diagram form the hardware and software blocks configured and used in a preferred method of the invention to initialize and adapt the short DPD block function software model.

FIG. 19 illustrates graphically a preferred methodology for modeling the short DPD block. In FIG. 19, the capture buffers Cap A 97 and Cap B 96 are again used to observe certain points in the system. The hardware portion of FIG. 18 captures the baseband data b (k) into the short DPD hardware portion 46, and, the capture buffer B is now configured to observe the output of summer 91 in FIG. 6. This output is the actual error observed. The goal is to create a software model and initialize the SDPD block so that the actual error is minimized, and, the error between the model and the hardware is eliminated.

The method preferred is to invert the simple software PA model for the linear and non-linear blocks, and, to map them to the SDPD hardware structure as an initial estimate. In FIG. 19, the short DPD hardware block 46 is depicted as a cascade arrangement of a Volterra function E and an equalizer G. The output of the SDPD hardware is then fed into the actual PA If the hardware is the ideal inverse of the PA model, then the error ~e (k) will be zero.

The hardware for the SDPD block as depicted in FIG. 9 is two blocks. These are the equalizer, a linear FIR filter with 16 taps and a three term Volterra filter.

The equalizer can be modeled as:

$$u(k, \theta_3) = \sum_{i=0}^{N-1} \theta_3(i) c(k-i)$$

or $$G(z, \theta_3) = \sum_{i=0}^{N-1} \theta_3(i) z^{-i}$$

The Volterra filter may be described as:

$$c(b, \theta_4) = F(b(k), \theta_4)$$

$$= v(k) \cdot \sum_{j=0}^{2} \sum_{i=0}^{N-1} \theta_4(i, j) B_i(\|b(k - d(j))\|^2)$$

The parameters for the Volterra filter are two dimensional as normally used in Volterra filtering notation. The variable d(j) is the delay used in into the jth look up table (LUT) driving the three tap FIR filter in the digital hardware.

Again the initial state of the SDPD hardware blocks must be estimated so that the Gauss-Newton method iterations used to determine the parameters will converge. It is preferred to break the initialization into two steps, first, the Linear (equalizer) portion is initialized, and then second the Nonlinear (Volterra) portion is initialized. These initializations are performed by approximately inverting the software PA model 411.

FIG. 18 is representative of the process of determining the SDPD hardware parameters for the block 46. Since the software PA model (shown as 411) has an FIR filter defined as H(z), the first step is to invert this function with another FIR filter to be used in the SDPD and denoted as G(z). The initial estimate for the parameters of the non-linear portion of the SDPD is the inverse of the function F(x) obtained in determining the software model for the power amplifier above and applied to the center look up table (LUT), while the others are set to zero. In one approach this is determined simply by evaluation of the function F(x) over approximately n points from zero to the peak level observed/n, where n was set to approximately 256 for a reasonable sampling of the curve and given practical computation time. Then, if y–F(x) over this range, the inversion is obtained by solving the least squared problem with the basis set chosen (preferably the Zernike polynomials) with the inputs and outputs swapped.

Once the initial SDPD parameters are set, these parameters are further refined using the Gauss Newton method as before.

Following the initialization and refinement of the parameters, the SDPD must be adapted using an iterative tracking process. The tracking algorithm, which will run in a loop in the digital signal processor or microprocessor that controls the DPD blocks, will periodically update the parameters to adapt the functional blocks.

Figure 20:
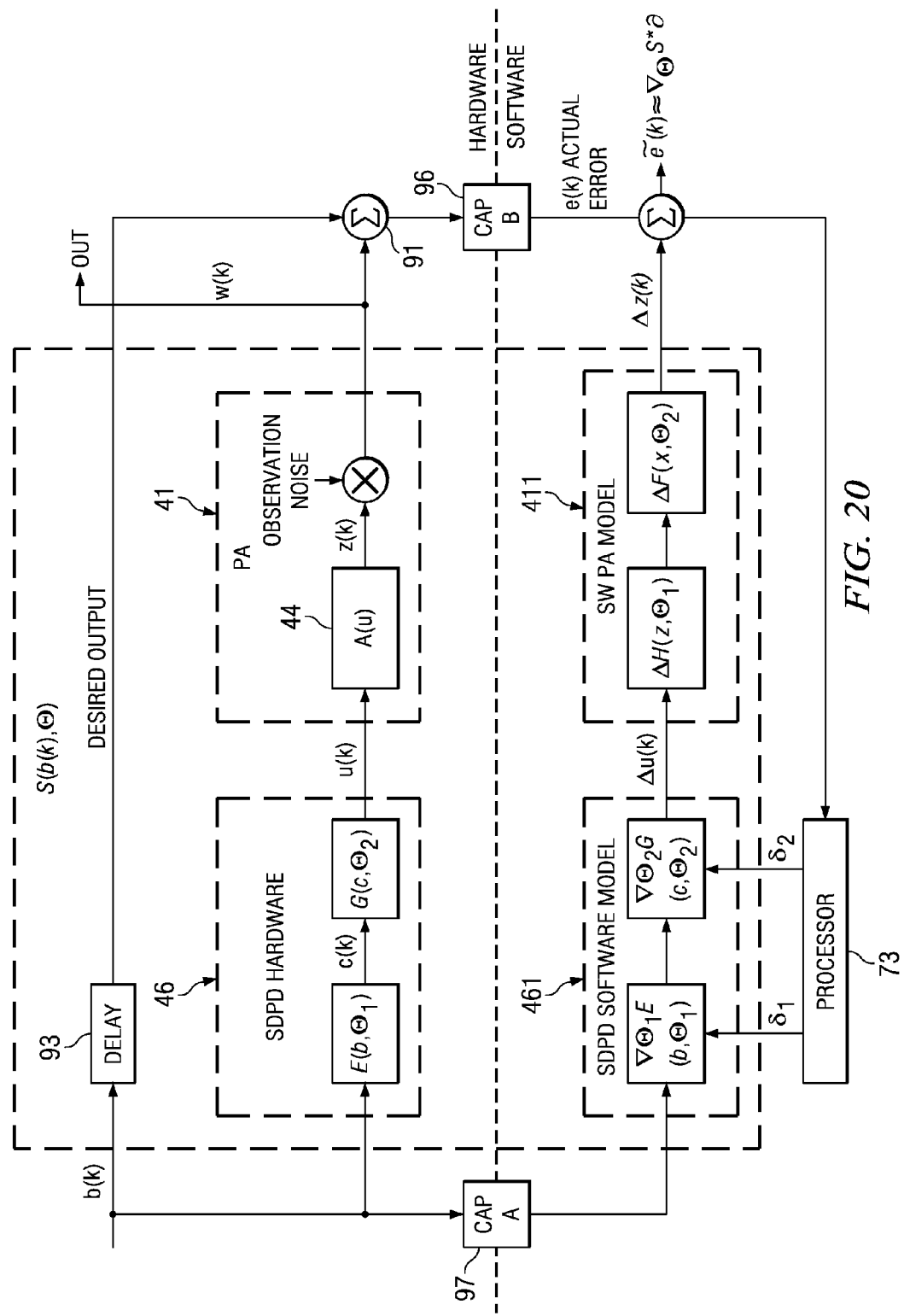
FIG. 20 depicts in block diagram form the hardware and software blocks configured and used in a preferred method of the invention to adapt the short DPD block function software model while the system of the invention is in operation.

FIG. 20 depicts an illustrative representation of the short DPD hardware block 46 functionality with the tracking algorithm software shown running the control processor 73 which outputs the adaptive changes $\delta_1$, $\delta_2$ in parameters to the differential parameter set shown in block 461 for the short DPD block 46 functions, the Volterra function E and the equalizer function G. Thus once the short DPD block 46 is initially parameterized, a looping approach is used to periodically update the parametric values for the Volterra function and the equalizer that comprise the short DPD block. The delta block 461 represents the change in parameters for the SDPD hardware block 46. Control processor 73 executes an algorithm to perform the short DPD tracking function to adapt the parameters during the operation of the power amplifier.

Figure 21:
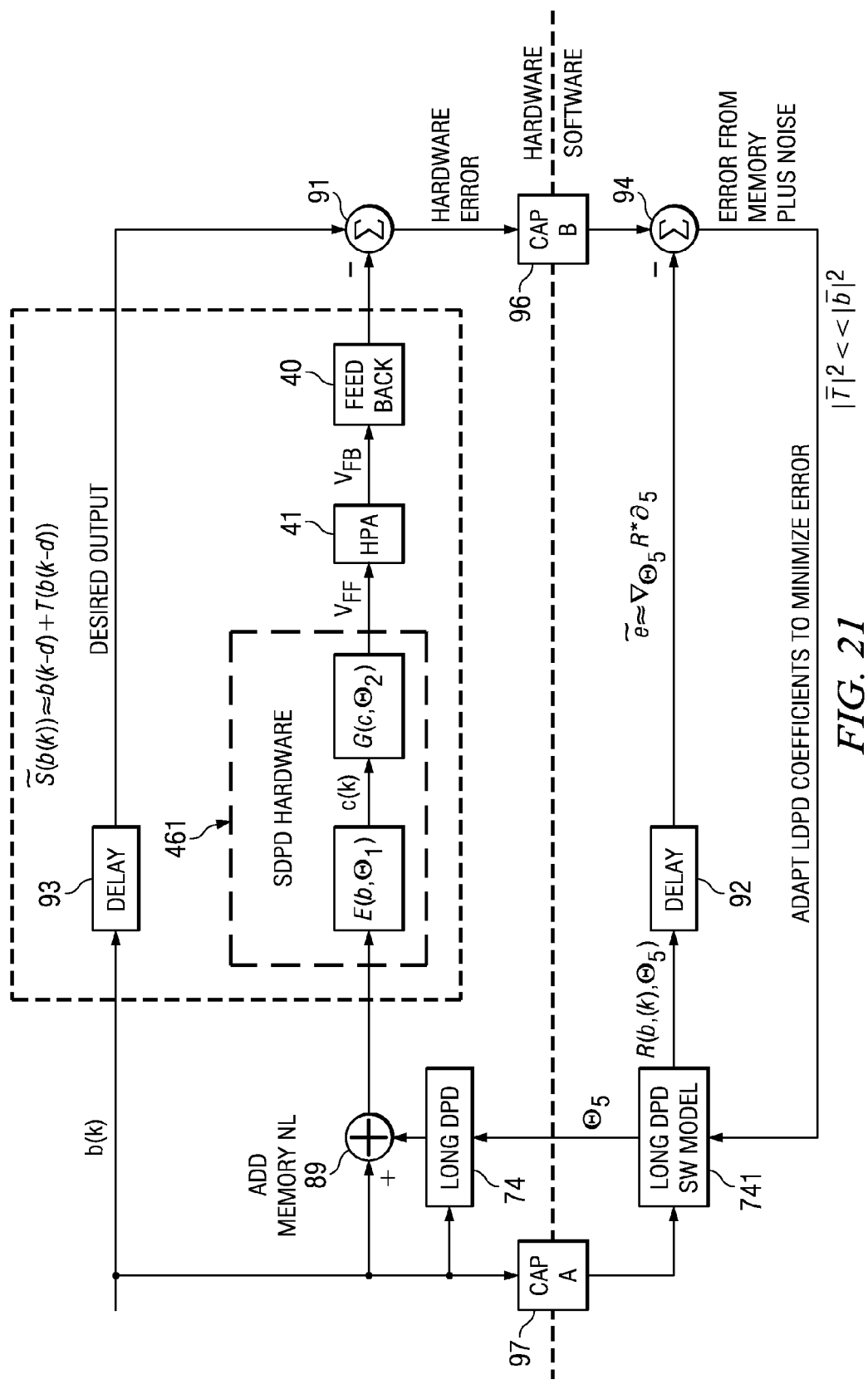
FIG. 21 depicts in block diagram form the hardware and software blocks configured and used in a preferred method of the invention to adapt the long DPD block function software model.

Finally, the long DPD block 74 of FIG. 6 must likewise be modeled and initialized. This process again involves modeling the long block in software, developing the model, initializing the model, and adapting the parameters of the model. FIG. 21 depicts the approach of a preferred method of the present invention, which is to treat the cascaded functions of the short DPD block, and the actual PA, as a simple non-linear element which requires linearization. This is represented in FIG. 21 by the expression:

$$\tilde{S}(b(k)) \approx b(k-d) + T(b(k-d)).$$

Thus the combined cascade is again treated as an element to be linearized. The same techniques are then applied as before, the goal is to find a model 741 for the long DPD block 74 that tracks the actual hardware and to parameterize the model and the block, initially, so that the error term is minimized and so that the model error is minimized. This will occur when the inequality $|T|^2 << |\tilde{b}|^2$ shown in FIG. 21 is satisfied. The error is minimized when the gradient function shown in FIG. 21, $\tilde{e} \approx \nabla_{\Theta_5} R^* \partial_5$ is determined.

In operation, the availability of the accurate software models for each of the blocks long DPD, short DPD, and the actual power amplifier PA, makes real-time and offline adaptation of the long and short predistortion blocks possible. By using the capture buffers to capture data in different places in the system, the control processor 73 of FIG. 20 or other external computing resources can be used to adaptively update the parameters for the short DPD and long DPD blocks on a periodic basis, without interrupting the ongoing operation of the system. This method advantageously allows real time adaptation and refinement of the models used while the system continues to be available for operation.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a baseband processing circuit that receives a baseband signal;
   a digital predistortion circuit including:
      a magnitude squared circuit that is coupled to the baseband processing circuit;
      a plurality of memory circuit that are coupled to the magnitude square circuit in parallel to one another, wherein each memory circuit includes:
         a first programmable non-linearity that is coupled to the magnitude squared circuit;
         a digital filter that is coupled to the first programmable non-linearity;
         a first delay circuit that is coupled to the magnitude squared circuit;
         a second programmable non-linearity that is coupled to the first delay circuit;
         a third delay circuit that is coupled to the baseband processing circuit; and
         a configurable output circuit that is coupled to the digital filter, the second programmable non-linearity and the third delay circuit, wherein the configurable output circuit has a plurality of modes, and wherein each filter mode is associated with at least one filter model for the digital predistortion circuit;
      a first summer that is coupled to each of the memory circuits; and
      a second summer that is coupled to the first summer and the baseband processing circuit;
   a feedback path that receives an output from a non-linear element as feedback; and
   a plurality of capture buffers that store samples from baseband signal and the feedback for adjusting parametric values of the first and second programmable non-linearities for each memory circuit.

2. The apparatus of claim 1, wherein the configurable output circuit further comprises:
   a first multiplier that is coupled to the second programmable non-linearity and the third delay circuit;
   a first multiplexer that is coupled to the digital filter;
   a second multiplexer that is coupled to the first multiplexer and the third delay circuit;
   a second multiplier that is coupled to the first and second multiplexers;
   a third summer that is coupled to the first multiplier and the second multiplier; and
   a third multiplexer that is coupled to the first multiplier, the second multiplier, and the third summer.

3. The apparatus of claim 2, wherein the plurality of modes further comprises a normal mode, a parallel mode, an upper Compound Volterra mode, and a lower Compount Volterra mode.

4. The apparatus of claim 3, wherein the configurable output circuit further comprises a second digital filter that is coupled between the third delay.

5. An apparatus comprising:
   a transmit processor including:
      a baseband processing circuit that receives a baseband signal;
      a digital predistortion circuit including:
         a magnitude squared circuit that is coupled to the baseband processing circuit;

a plurality of memory circuit that are coupled to the magnitude square circuit in parallel to one another, wherein each memory circuit includes:
  a first programmable non-linearity that is coupled to the magnitude squared circuit;
  a digital filter that is coupled to the first programmable non-linearity;
  a first delay circuit that is coupled to the magnitude squared circuit;
  a second programmable non-linearity that is coupled to the first delay circuit;
  a third delay circuit that is coupled to the baseband processing circuit; and
  a configurable output circuit that is coupled to the digital filter, the second programmable non-linearity and the third delay circuit, wherein the configurable output circuit has a plurality of modes, and wherein each filter mode is associated with at least one filter model for the digital predistortion circuit;
a first summer that is coupled to each of the memory circuits; and
a second summer that is coupled to the first summer and the baseband processing circuit;
a feedback path that receives feedback; and
a plurality of capture buffers that store samples from baseband signal and the feedback for adjusting parametric values of the first and second programmable non-linearities for each memory circuit;
a digital-to-analog converter (DAC) that is coupled to the digital predistortion circuit;
a first mixer that is coupled to the DAC;
a power amplifier that is coupled to the first mixer;
a radio frequency (RF) coupler that is coupled to the power amplifier;
an antenna that is coupled to the RF coupler;
a second mixer that is coupled to the RF coupler;
a local oscillator that is coupled to the first and second mixers;
an analog-to-digital converter (ADC) that is coupled between the second mixer and the feedback path; and
a control processor that is coupled to the capture buffers.

6. The apparatus of claim 5, wherein the configurable output circuit further comprises:
a first multiplier that is coupled to the second programmable non-linearity and the third delay circuit;
a first multiplexer that is coupled to the digital filter;
a second multiplexer that is coupled to the first multiplexer and the third delay circuit;
a second multiplier that is coupled to the first and second multiplexers;
a third summer that is coupled to the first multiplier and the second multiplier; and
a third multiplexer that is coupled to the first multiplier, the second multiplier, and the third summer 7. The apparatus of claim 6, wherein the plurality of modes further comprises a normal mode, a parallel mode, an upper Compound Volterra mode, and a lower Compount Volterra mode.

8. The apparatus of claim 7, wherein the configurable output circuit further comprises a second digital filter that is coupled between the third delay.

9. A method comprising:
receiving a baseband signal;
generating an input signal from the baseband signal;
digitally predistorting the input signal to compensate for non-linear distortion in a non-linear element by:
  squaring the magnitude of the input signal to generate a squared magnitude signal;
  generating a plurality of output signals from the squared magnitude signal and the input signal, wherein each output signal is generated by:
    generating a first response signal by applying the squared magnitude signal to its first programmable non-linearity;
    digitally filtering the first response signal to generate a digitally filtered signal;
    delaying the squared magnitude signal to generate a delayed signal;
    generating a second response signal by applying the delayed signal to its second programmable non-linearity;
    delaying the input signal to generate a delayed input signal; and selectively combining the digitally filtered signal, the second response signal, and the delayed input signal;
  summing the plurality of output signals together to generate a summed signal; and
  summing the first summed signal with the input signal to generate compensated signal;
receiving an output from the non-linear element as a feedback; and
adapting parametric values within the programmable non-linearities in response to analysis of the baseband signal and the feedback.

10. The method of claim 9, wherein the step of digitally predistoring further comprises applying Hammerstein filter to the input signal.

11. The method of claim 10, wherein the step of digitally predistorting further comprises selectively configuring the combination for the digitally filtered signal, the second response signal, and the delayed input signal for each output signal and the summed signal to form a digital predistortion filter in parallel cascade form.

12. The method of claim 11, wherein the step of digitally filtering further comprises applying a linear finite impulse response (FIR) filter.

* * * * *